(12) United States Patent
Wang et al.

(10) Patent No.: US 11,798,474 B2
(45) Date of Patent: Oct. 24, 2023

(54) DISPLAY PANEL, DRIVING METHOD THEREOF AND DISPLAY DEVICE

(71) Applicant: BOE TECHNOLOGY GROUP CO., LTD., Beijing (CN)

(72) Inventors: Li Wang, Beijing (CN); Qian Yang, Beijing (CN); Tian Dong, Beijing (CN); Renrong Gai, Beijing (CN); Jingquan Wang, Beijing (CN); Bo Wang, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 128 days.

(21) Appl. No.: 17/435,249

(22) PCT Filed: Oct. 27, 2020

(86) PCT No.: PCT/CN2020/123974
§ 371 (c)(1),
(2) Date: Aug. 31, 2021

(87) PCT Pub. No.: WO2022/087821
PCT Pub. Date: May 5, 2022

(65) Prior Publication Data
US 2022/0215799 A1 Jul. 7, 2022

(51) Int. Cl.
G09G 3/3233 (2016.01)
H10K 59/131 (2023.01)

(52) U.S. Cl.
CPC ......... G09G 3/3233 (2013.01); H10K 59/131 (2023.02); G09G 2300/0842 (2013.01);
(Continued)

(58) Field of Classification Search
CPC .......................... G09G 3/3233; H10K 59/131
See application file for complete search history.

(56) References Cited

U.S. PATENT DOCUMENTS 10,121,415 B2 * 11/2018 Lee ..................... H01L 27/1255
10,283,045 B2    5/2019 Shibusawa et al.
(Continued)

FOREIGN PATENT DOCUMENTS

CN    105513539 A    4/2016
CN    106997746 A    8/2017
(Continued)

Primary Examiner — Sardis F Azongha
(74) Attorney, Agent, or Firm — Chiwin Law LLC

(57) ABSTRACT

A display panel and a driving method thereof and a display device are provided. The display panel includes a pixel circuit and a light-emitting element, the pixel circuit including a driving transistor, a first reset transistor and a second reset transistor; the first reset transistor being connected with a gate electrode of the driving transistor and configured to reset the gate electrode of the driving transistor, and the second reset transistor being configured to reset the first electrode of the light-emitting element; a first initialization signal line, connected with the gate electrode of the driving transistor through the first reset transistor; and a second initialization signal line, connected with the first electrode of the light-emitting element through the second reset transistor. The first initialization signal line and the second initialization signal line are insulated from each other and are configured to supply signals respectively.

20 Claims, 14 Drawing Sheets

(52) U.S. Cl.
CPC ... *G09G 2310/061* (2013.01); *G09G 2310/08* (2013.01); *G09G 2320/0214* (2013.01); *G09G 2320/0247* (2013.01)

(56) References Cited

U.S. PATENT DOCUMENTS

| | | | |
|---|---|---|---|
| 10,319,297 | B2 | 6/2019 | Morita et al. |
| 10,600,855 | B2 * | 3/2020 | Song ............... H10K 59/124 |
| 10,770,004 | B2 | 9/2020 | Kim et al. |
| 11,176,883 | B2 * | 11/2021 | Na ..................... H01L 27/1222 |
| 2016/0104427 | A1 | 4/2016 | Matsueda et al. |
| 2016/0260379 | A1 | 9/2016 | Jeon |
| 2019/0073955 | A1 * | 3/2019 | Zou ..................... G09G 3/3258 |
| 2020/0273411 | A1 | 8/2020 | Gao et al. |
| 2021/0020109 | A1 | 1/2021 | Lin et al. |
| 2021/0210518 | A1 * | 7/2021 | Tanaka ................... G09G 3/32 |

FOREIGN PATENT DOCUMENTS

| | | | |
|---|---|---|---|
| CN | 107799057 | A | 3/2018 |
| CN | 208335702 | U | 1/2019 |
| CN | 109599062 | A | 4/2019 |
| CN | 111145696 | A | 5/2020 |
| CN | 111435587 | A | 7/2020 |
| EP | 3796302 | A | 3/2021 |
| KR | 20190046135 | A | 5/2019 |
| WO | 2020066447 | A | 4/2020 |

* cited by examiner

DISPLAY PANEL, DRIVING METHOD THEREOF AND DISPLAY DEVICE

This application is a U.S. National Phase Entry of International Application No. PCT/CN2020/123974 filed on Oct. 27, 2020, designating the United States of America. The present application claims priority to and the benefit of the above-identified application and the above-identified applications are incorporated by reference herein in their entirety.

TECHNICAL FIELD

At least one embodiment of the present disclosure relates to a display panel, a driving method thereof and a display device.

BACKGROUND

With the continuous development of display technology, Active-Matrix Organic Light-Emitting Diode (AMOLED) display technology has been increasingly applied in display devices such as mobile phones, tablet computers, and digital cameras due to its advantages such as self-luminescence, wide viewing angle, high contrast, low power consumption, and high response speed.

Unlike Liquid Crystal Display (LCD), which uses a stable voltage to control brightness, OLED is driven by a current and requires a stable current to control its light-emitting. The basic function of the pixel circuit in the AMOLED display device is to refresh the display signal at the beginning of the frame period, and use the storage capacitor Cst to maintain a stable signal voltage during the frame period and apply it to the control terminal of a driving component, such as between the gate electrode and the source electrode of a driving thin film transistor (TFT, DTFT), so that the driving component can stably output the driving current in the frame period to drive the OLED to emit light.

SUMMARY

At least one embodiment of the present disclosure relates to a display panel, a driving method thereof and a display device.

At least one embodiment of the present disclosure provides a display panel, comprising: a light-emitting unit, comprising a pixel circuit and a light-emitting element, the pixel circuit being configured to drive the light-emitting element, the pixel circuit comprising a driving transistor, a first reset transistor and a second reset transistor; the first reset transistor being connected with a gate electrode of the driving transistor and configured to reset the gate electrode of the driving transistor, and the second reset transistor being connected with a first electrode of the light-emitting element and being configured to reset the first electrode of the light-emitting element; a first initialization signal line, connected with the gate electrode of the driving transistor through the first reset transistor; and a second initialization signal line, connected with the first electrode of the light-emitting element through the second reset transistor. The first initialization signal line and the second initialization signal line are insulated from each other and are configured to supply signals respectively.

In some embodiments of the present disclosure, a first electrode of the first reset transistor is connected with the first initialization signal line, and a second electrode of the first reset transistor is connected with the gate electrode of the driving transistor; a first electrode of the second reset transistor is connected with the second initialization signal line, and a second electrode of the second reset transistor is connected with the first electrode of the light-emitting element.

In some embodiments of the present disclosure, the first initialization signal line is configured to supply an alternating current signal; the first initialization signal line is configured to supply a first voltage to the first reset transistor in a phase of resetting the gate electrode of the driving transistor and configured to supply a second voltage to the first reset transistor in a light-emitting phase of the light-emitting element, and the second voltage is greater than the first voltage.

In some embodiments of the present disclosure, the second initialization signal line is configured to supply a direct current signal.

In some embodiments of the present disclosure, the first initialization signal line and the second initialization signal line are extended substantially in a same direction.

In some embodiments of the present disclosure, the first initialization signal line and the second initialization signal line are both extended in a first direction, and the light-emitting unit comprises a first light-emitting unit and a second light-emitting unit that are adjacent to each other in a second direction, the second direction intersecting with the first direction; in the second direction, the second initialization signal line of the second light-emitting unit and the first initialization signal line of the first light-emitting unit are located between the driving transistor of the first light-emitting unit and the driving transistor of the second light-emitting unit; and the second initialization signal line of the second light-emitting unit is closer to the driving transistor of the first light-emitting unit than the first initialization signal line of the first light-emitting unit.

In some embodiments of the present disclosure, the display panel further comprises a base substrate; the first reset transistor is a dual-gate transistor, the first reset transistor comprises a first channel and a second channel, the first channel and the second channel are connected by a first conductive connection portion, an orthographic projection of the first conductive connection portion of the first reset transistor of the first light-emitting unit on the base substrate at least partially falls within an orthographic projection of the second initialization signal line of the second light-emitting unit on the base substrate.

In some embodiments of the present disclosure, the first conductive connection portion of the first reset transistor of the first light-emitting unit and the second initialization signal line of the second light-emitting unit form a stabilization capacitor.

In some embodiments of the present disclosure, orthographic projections of a first gate electrode and a second gate electrode of the first reset transistor on the base substrate are respectively overlapped with orthographic projections of the first channel and the second channel of the first reset transistor on the base substrate.

In some embodiments of the present disclosure, the display panel further comprises a reset control signal line, a first gate electrode and a second gate electrode of the first reset transistor are parts of the reset control signal line, respectively.

In some embodiments of the present disclosure, the display panel further comprises a first power line, and the first power line is configured to supply a first voltage signal to the pixel circuit; the pixel circuit further comprises a storage capacitor, a first electrode of the storage capacitor is connected with the gate electrode of the driving transistor, and a second electrode of the storage capacitor is connected with the first power line; and an orthographic projection of the first power line on the base substrate at least partially overlap with an orthographic projection of the first conductive connection portion on the base substrate.

In some embodiments of the present disclosure, the first power line and the first conductive connection portion form a stabilization capacitor.

In some embodiments of the present disclosure, the orthographic projection of the first conductive connection portion on the base substrate falls within the orthographic projection of the first power line on the base substrate.

In some embodiments of the present disclosure, the gate electrode of the driving transistor is connected with a second electrode of the first reset transistor through a connecting line, and an orthographic projection of the first power line on the base substrate at least partially overlap with an orthographic projection of the connecting line on the base substrate.

In some embodiments of the present disclosure, the orthographic projection of the connecting line on the base substrate falls within the orthographic projection of the first power line on the base substrate.

In some embodiments of the present disclosure, the connecting line and the first power line form a stabilization capacitor.

In some embodiments of the present disclosure, the first power line is in a grid shape and comprises a first portion extended in the first direction and a second portion extended in the second direction, and the first portion intersects with the second portion.

In some embodiments of the present disclosure, the display panel further comprises a power connection line, and the first power line is connected with the second electrode of the storage capacitor through the power connection line.

In some embodiments of the present disclosure, the display panel further comprises a connection electrode, one end of the connection electrode is electrically connected with the first initialization signal line, and the other end of the connection electrode is electrically connected with a first electrode of the first reset transistor; a plurality of connection electrodes and a plurality of power connection lines are provided, and the plurality of connection electrodes and the plurality of power connection lines are alternately arranged in the second direction.

In some embodiments of the present disclosure, the display panel further comprises a gate line and a data line, and the gate line is configured to input a scan signal to the pixel circuit, and the data line is configured to input a data signal to the pixel circuit; and the pixel circuit further comprises a data writing transistor, a gate electrode of the data writing transistor is connected with the gate line, a first electrode of the data writing transistor is connected with the data line, and a second electrode of the driving transistor is connected with a first electrode of the driving transistor.

In some embodiments of the present disclosure, the pixel circuit further comprises a threshold compensation transistor, a gate electrode of the threshold compensation transistor is connected with the gate line, and a first electrode of the threshold compensation transistor is connected with a second electrode of the driving transistor, and a second electrode of the threshold compensation transistor is connected with the gate electrode of the driving transistor.

In some embodiments of the present disclosure, the threshold compensation transistor is a dual-gate transistor, the threshold compensation transistor comprises a first channel and a second channel, and the first channel and the second channel of the threshold compensation transistor are connected by a second conductive connection portion, and an orthographic projection of the second conductive connection portion on the base substrate is at least partially overlapped with the orthographic projection of the first power line on the base substrate.

In some embodiments of the present disclosure, the orthographic projection of the second conductive connection portion on the base substrate completely falls within the orthographic projection of the first power line on the base substrate.

In some embodiments of the present disclosure, the second conductive connection portion and the first power line form a stabilization capacitor.

In some embodiments of the present disclosure, the display panel further comprises a blocking portion, and the blocking portion is connected with the first power line, an orthographic projection of the second conductive connection portion on the base substrate is at least partially overlapped with an orthographic projection of the blocking portion on the base substrate, and the blocking portion and the second conductive connection portion form a stabilization capacitor.

In some embodiments of the present disclosure, the display panel further comprises a light-emitting control signal line; the pixel circuit further comprises a first light-emitting control transistor and a second light-emitting control transistor, a gate electrode of the first light-emitting control transistor is connected with the light-emitting control signal line, a first electrode of the first light-emitting control transistor is connected with the first power line, and a second electrode of the first light-emitting control transistor is connected with a first electrode of the driving transistor; a gate electrode of the second light-emitting control transistor is connected with the light-emitting control signal line, a first electrode of the second light-emitting control transistor is connected with a second electrode of the driving transistor, and a second electrode of the second light-emitting control transistor is connected with the first electrode of the light-emitting element.

In some embodiments of the present disclosure, the display panel further comprises a second power supply terminal, the second power supply terminal is connected with a second electrode of the light-emitting element.

At least one embodiment of the present disclosure provides a display device comprising the display panel provided by any one of the above embodiments.

At least one embodiment of the present disclosure provides a driving method of a display panel, comprising: in a reset phase, resetting a gate electrode of a driving transistor and resetting a first electrode of a light-emitting element; resetting the gate electrode of the driving transistor comprising: setting a reset control signal to be a turn-on voltage, and turning on a first reset transistor, supplying a first voltage to the first electrode of the first reset transistor to transmit the first voltage to the gate electrode of the driving transistor through the first reset transistor, a second electrode being connected with the gate electrode of the driving transistor, a gate electrode of the first reset transistor being connected with a reset control signal line, and the reset control signal line being configured to supply the reset control signal; and in a light-emitting phase, driving the light-emitting element to emit light, and supplying a second voltage to the first electrode of the first reset transistor, the second voltage being greater than the first voltage.

In some embodiments of the present disclosure, resetting the first electrode of the light-emitting element comprises:

transmitting an initialization signal to the first electrode of the light-emitting element through a second reset transistor.

In some embodiments of the present disclosure, the initialization signal is a direct current signal.

BRIEF DESCRIPTION OF THE DRAWINGS

In order to clearly illustrate the technical solution of the embodiments of the present disclosure, the drawings of the embodiments will be briefly described in the following. It is obvious that the described drawings are only related to some embodiments of the present disclosure and thus are not construed as any limitation of the present disclosure.

DETAILED DESCRIPTION

Figure 1:
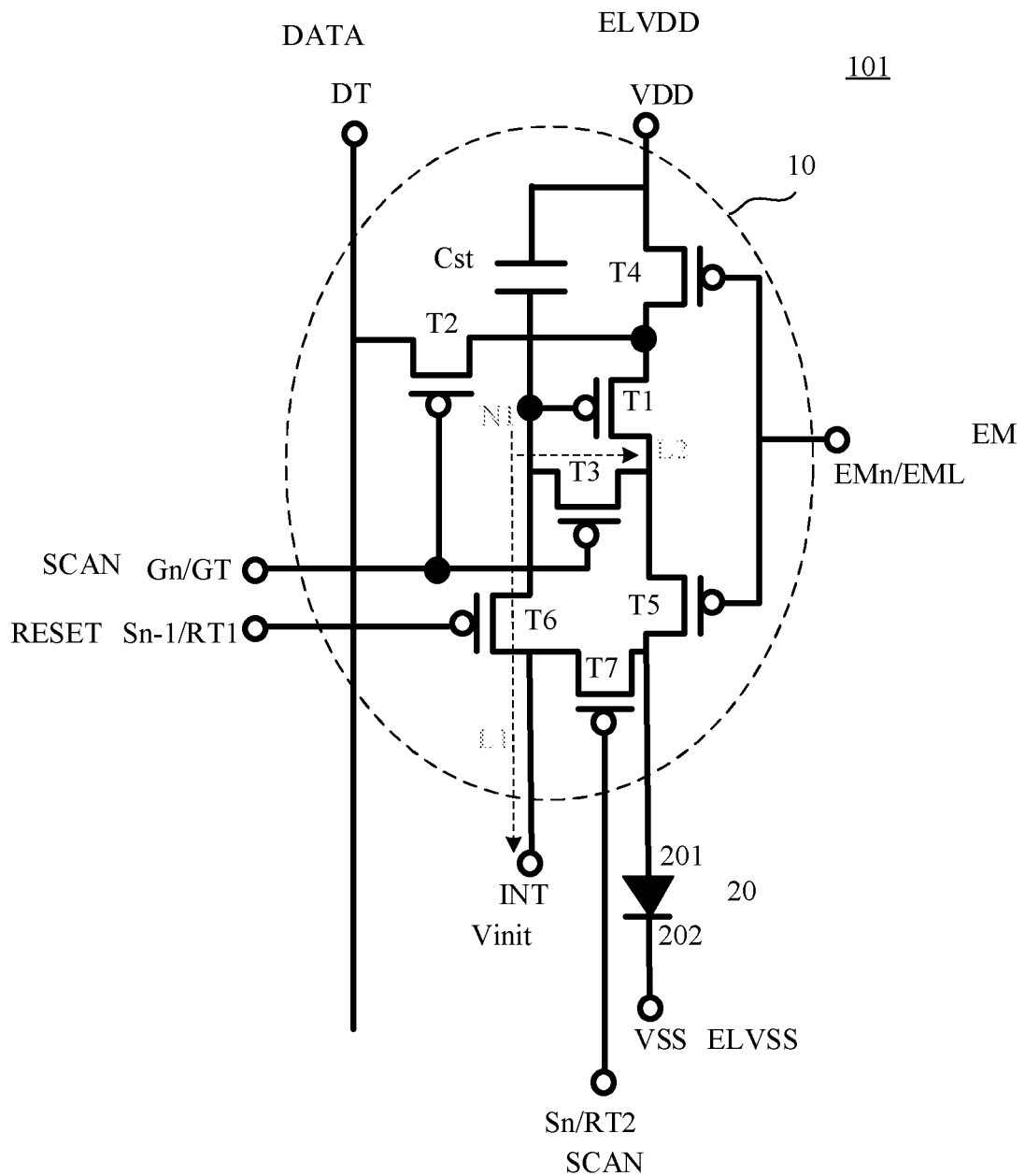
FIG. 1 is a schematic diagram of a 7T1C pixel circuit.

For more clear understanding of the objectives, technical details and advantages of the embodiments of the present disclosure, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment (s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise", "comprising", "include", "including", etc., are intended to specify that the elements or the objects stated before these terms encompass the elements or the objects and equivalents thereof listed after these terms, but do not preclude the other elements or objects. The phrases "connect", "connected" and the like are not limited to a physical or mechanical connection, but also include an electrical connection, either directly or indirectly. "On," "under," "right," "left" and the like are only used to indicate relative position relationship, and when the position of the described object is changed, the relative position relationship may be changed accordingly.

At present, there is a large demand for low frame rate AMOLED display panels in the market, and the main problem of low grayscale display is that the display time of one frame is prolonged and the current leakage problem is serious. The flicker problem caused by current leakage of low frame rate AMOLED display panels needs to be solved urgently.

In the display device, the pixel unit includes a pixel circuit and a light-emitting element, and the pixel circuit is configured to drive the light-emitting element to emit light. In the embodiments of the present disclosure, the light-emitting element is an OLED as an example, but it is not limited thereto. For example, the pixel circuit is configured to supply a driving current to drive the light-emitting element to emit light. In the frame period between two signal refreshes of the pixel circuit, the voltage holding ratio (VHR) of the storage capacitor Cst determines the stability and effective average value of the driving current of the light-emitting element in the pixel unit, thereby determining the display luminescence stability and effective brightness of the pixel unit, and the current leakage of the related loop formed by the switch TFT (STFT) in the pixel circuit has a direct impact on the voltage holding ratio of the storage capacitor Cst, resulting in visual flicker.

Figure 2:
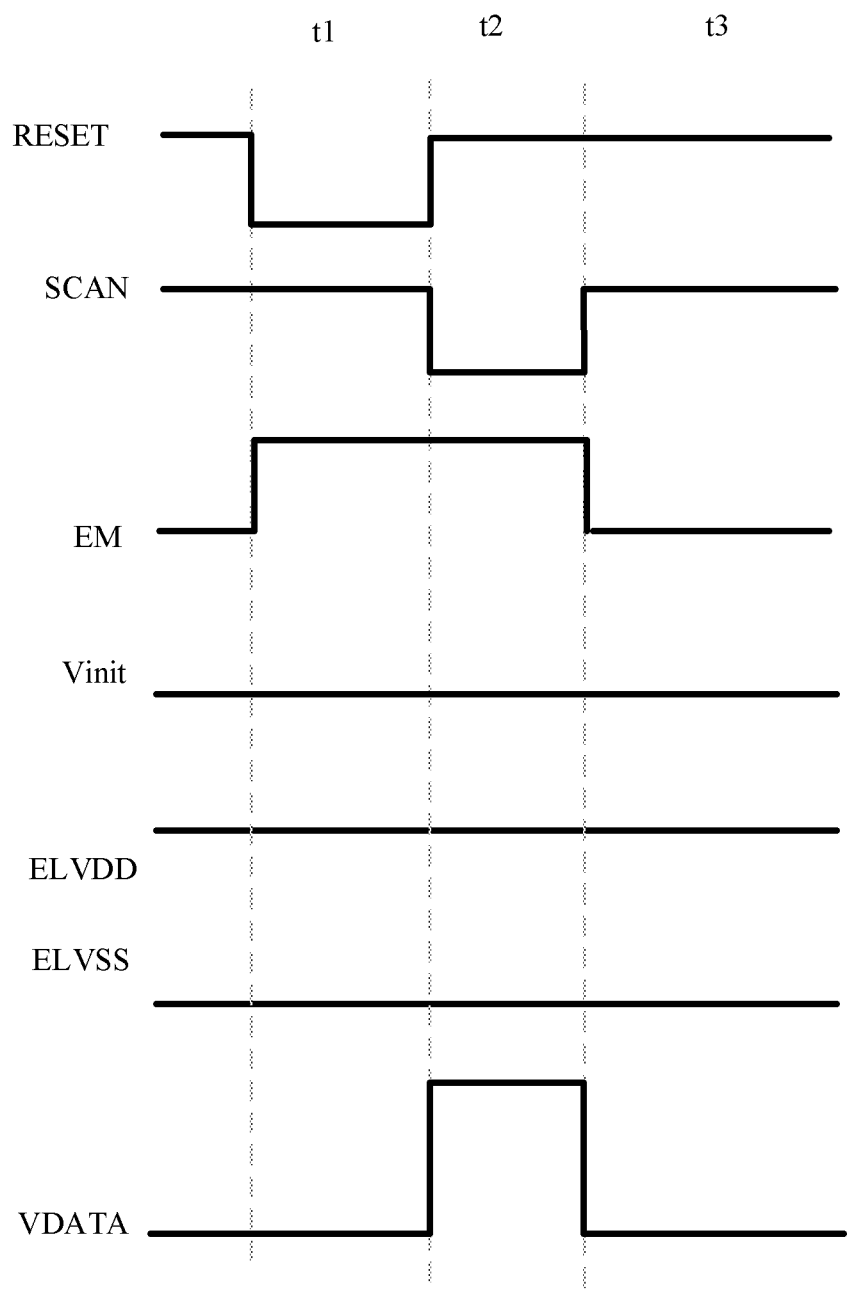
FIG. 2 is a working timing diagram of the pixel circuit as illustrated in FIG. 1.

FIG. 1 is a schematic diagram of a 7T1C pixel circuit. FIG. 2 is a working timing diagram of the pixel circuit illustrated in FIG. 1. The pixel circuit illustrated in FIG. 1 may be a low temperature poly-silicon (LTPS) AMOLED pixel circuit commonly used in related technologies.

As illustrated in FIG. 1, the pixel unit 101 includes a pixel circuit 10 and a light-emitting element 20. The pixel circuit 10 includes six switching transistors (T2-T7), a driving transistor T1, and a storage capacitor Cst. The six switching transistors are a data writing transistor T2, a threshold compensation transistor T3, a first light-emitting control transistor T4, a second light-emitting control transistor T5, a first reset transistor T6, and a second reset transistor T7. The light-emitting element 20 includes a first electrode 201, a second electrode 202, and a light-emitting functional layer located between the first electrode 201 and the second electrode 202. For example, the first electrode 201 is an anode, and the second electrode 202 is a cathode. Generally, the threshold compensation transistor T3 and the first reset transistor T6 adopt a dual-gate TFT (that is, two sub-TFTs in series) to reduce current leakage.

As illustrated in FIG. 1, the display panel includes a gate line GT, a data line DT, a first power supply terminal VDD, a second power supply terminal VSS, a light-emitting control signal line EML, an initialization signal line INT, a first reset control signal line RT1, and a second reset control signal line RT2, etc. The first power supply terminal VDD is configured to supply a constant first voltage signal ELVDD to the pixel unit 101, the second power supply terminal VSS is configured to supply a constant second voltage signal ELVSS to the pixel unit 101, and the first voltage signal ELVDD is greater than the second voltage signal ELVSS. The gate line GT is configured to supply a scan signal SCAN to the pixel unit 101, the data line DT is configured to supply a data signal DATA (data voltage VDATA) to the pixel unit 101, and the light-emitting control signal line EML is configured to supply a light-emitting control signal EM to the pixel unit 101, the first reset control signal line RT1 is configured to supply a reset control signal RESET to the pixel unit 101, the second reset control signal line RT1 is configured to supply a scan signal SCAN to the pixel unit 101, and the initialization signal line INT is configured to supply an initialization signal Vinit to the pixel unit 101. For example, the initialization signal Vinit is a constant voltage signal, and its magnitude may be between the first voltage signal ELVDD and the second voltage signal ELVSS, but it is not limited thereto. For example, the initialization signal Vinit may be less than or equal to the second voltage signal ELVSS.

As illustrated in FIG. 1, the driving transistor T1 is electrically connected with the light-emitting element 20, and outputs a driving current to drive the light-emitting element 20 to emit light under the control of the scan signal SCAN, the data signal DATA, the first voltage signal ELVDD, the second voltage signal ELVSS, etc.

As illustrated in FIG. 2, during one frame of display period, the driving method of the pixel unit includes a first reset phase t1, a data writing and threshold compensation and second reset phase t2, and a light-emitting phase t3. When the reset control signal RESET is at a low level, the gate electrode of the driving transistor T1 is reset, and when the scan signal SCAN is at a low level, the first electrode 201 (for example, the anode) of the light-emitting element 20 is reset. For example, as illustrated in FIG. 1, the voltage of the gate electrode of the driving transistor T1 is the voltage of the first node N1. When the scan signal SCAN is at a low level, the data voltage VDATA is written in, the threshold voltage Vth of the driving transistor T1 is obtained at the same time, and the data voltage VDATA containing the data information on the data line is stored in the capacitor Cst; when the light-emitting control signal line EML is at a low level, the light-emitting element 20 emits light, and the holding of the voltage of the first node N1 (the light-emitting stability of the light-emitting element 20) is maintained by the storage capacitor Cst. During the driving process of the pixel circuit 10, in the light-emitting phase, the storage capacitor is used to maintain the voltage signal, so that the potential of the signal holding terminal of the storage capacitor can be kept constant, and a voltage is formed between the gate electrode and the source electrode of the driving transistor, thereby controlling the driving transistor to form the driving current and driving the light-emitting element 20 to emit light. In this process, because there is a current leakage path at the node (the first node N1) where the signal holding terminal of the storage capacitor is coupled to the control electrode of the driving transistor, this node will leak through the current leakage path, rendering the signal holding terminal of the storage capacitor unable to keep constant for a long time, thereby causing the driving current formed by the driving transistor to be unstable, which affects the light-emitting brightness of the light-emitting component, and further affects the display effect of the display device.

Referring to FIG. 1 and FIG. 2, the initialization signal Vinit is usually a low voltage, for example, of about −3V. In the light-emitting phase t3, because the potential of the first node N1 is lower than the voltage of the initialization signal Vinit, a current leakage path L1 through the first reset transistor T6 is generated. Correspondingly, in the light-emitting phase t3, a current leakage path L2 through the threshold compensation transistor T3 may also be generated. The current leakage causes the electric potential of the first node N1 to change, so that the display brightness fluctuates in the frame period, thereby generating visual flicker. Generally, the current leakage path L1 has a more serious impact on the display effect than the current leakage path L2.

Figure 3:
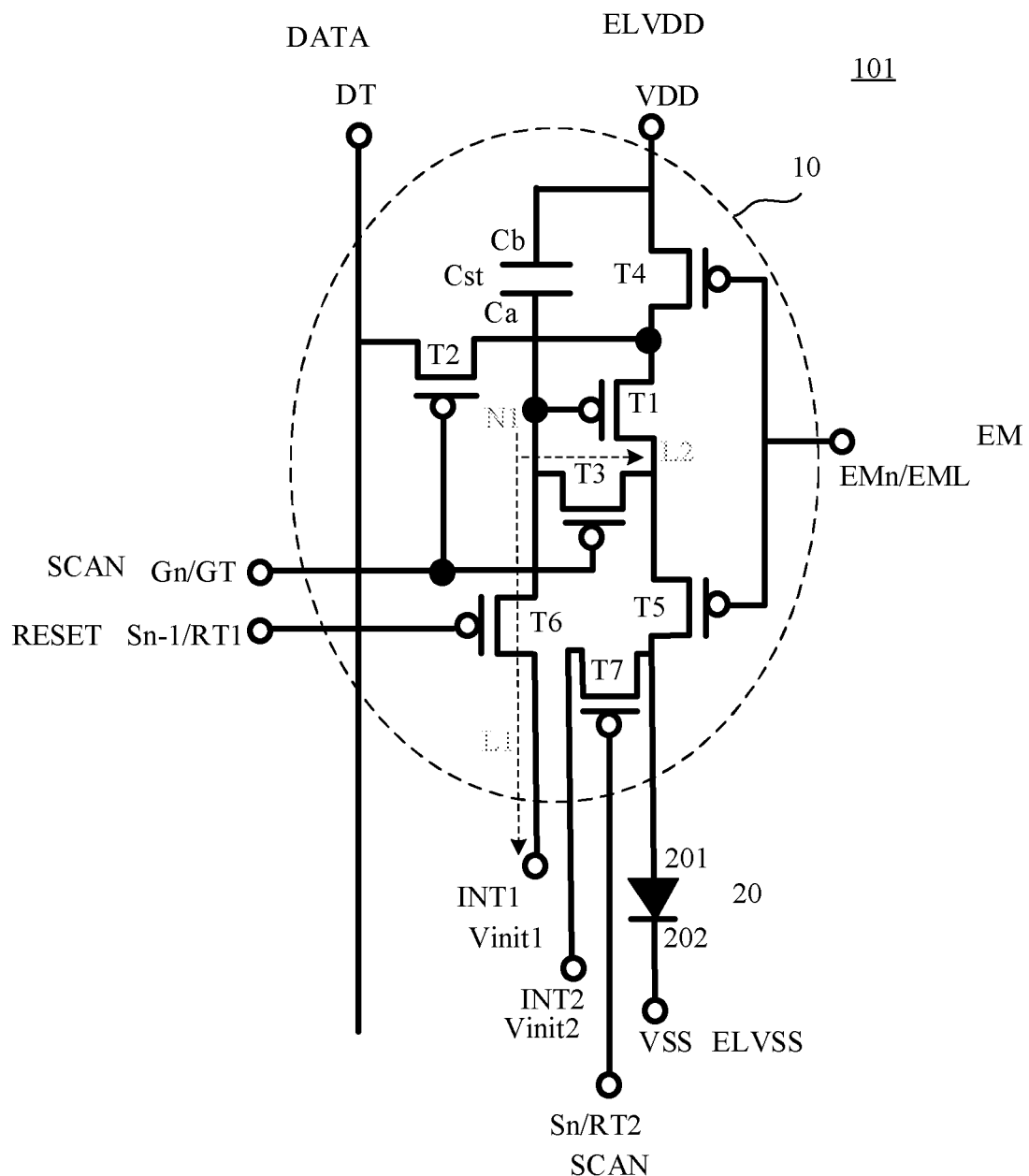
FIG. 3 is a schematic diagram of a pixel circuit of a display panel provided by an embodiment of the present disclosure.
Figure 4:
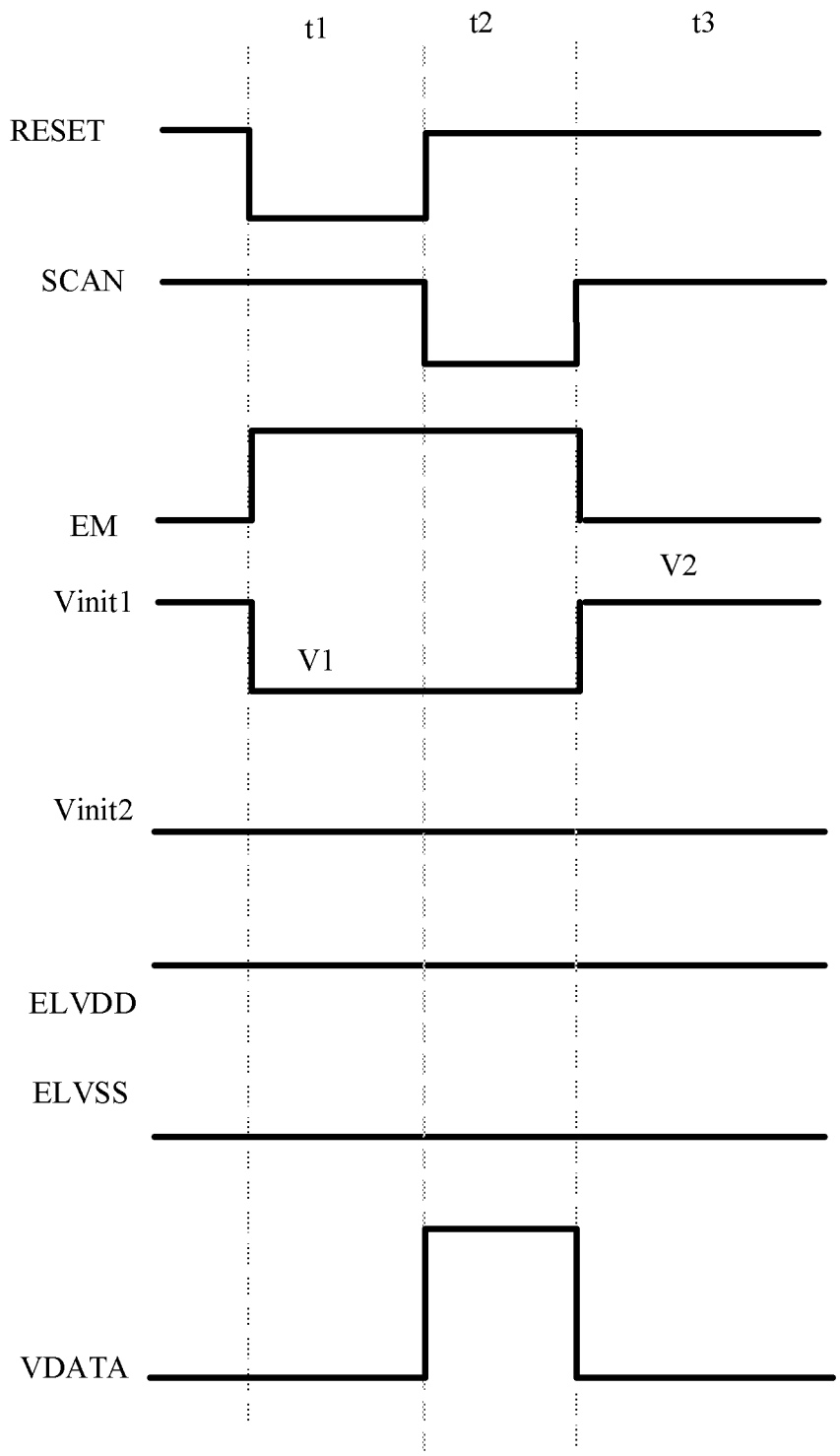
FIG. 4 is a working timing diagram of the pixel circuit as illustrated in FIG. 3.

FIG. 3 is a schematic diagram of a pixel circuit of a display panel provided by an embodiment of the present disclosure. FIG. 4 is a working timing diagram of the pixel circuit illustrated in FIG. 3. The display panel includes a plurality of pixel units 101. As illustrated in FIG. 3, each pixel unit 101 includes a pixel circuit 10 and a light-emitting element 20. As illustrated in FIG. 4, during a display period of one frame, the driving method of the pixel unit includes a first reset phase t1, a data writing and threshold compensation and second reset phase t2, and a light-emitting phase t3.

As illustrated in FIG. 3, the pixel circuit includes a driving transistor T1, a first reset transistor T6, and a second reset transistor T7; the first reset transistor T6 is connected with the gate electrode of the driving transistor T1 and is configured to reset the gate electrode of the driving transistor T1. The second reset transistor T7 is connected with the first electrode 201 of the light-emitting element 20 and is configured to reset the first electrode 201 of the light-emitting element 20. The first initialization signal line INT1 is connected with the gate electrode of the driving transistor T1 through the first reset transistor T6. The second initialization signal line INT2 is connected with the first electrode 201 of the light-emitting element 20 through the second reset transistor T7. The first initialization signal line INT1 and the second initialization signal line INT2 are insulated from each other and are configured to supply signals, respectively.

The display panel provided by the embodiment of the present disclosure can supply signals to the first initialization signal line INT1 and the second initialization signal line INT2, which are insulated from each other, respectively, increase the potential of the first initialization signal line INT1 in the light-emitting phase, and reduce the current leakage of the first node N1 in the light-emitting phase, increase the voltage holding ratio of the storage capacitor in the pixel circuit, and alleviate the flicker deterioration problem caused by the excessive leakage current, so that the display is flicker-free, and the display quality of the display product is improved. For example, the display panel provided by the embodiment of the present disclosure can alleviate the flicker problem caused by the excessive leakage current under the condition of low frame rate driving, and has good display quality. For example, in some embodiments, the display panel including the first initialization signal line INT1 and the second initialization signal line INT2 as described above can achieve driving of 30 Hz without affecting the display effect.

For example, the light-emitting element 20 is an organic light-emitting diode (OLED), and the light-emitting element 20 emits red light, green light, blue light, or white light under the driving of the pixel circuit 10 corresponding thereto. For example, one pixel includes a plurality of pixel units. One pixel may include a plurality of pixel units that emit light of different colors. For example, one pixel includes a pixel unit that emits red light, a pixel unit that emits green light, and a pixel unit that emits blue light, but it is not limited thereto. The number of pixel units included in one pixel and the light emitted by each pixel unit can be determined according to needs.

For example, as illustrated in FIG. 3, the first electrode of the first reset transistor T6 is connected with the first initialization signal line INT1, the second electrode of the first reset transistor T6 is connected with the gate electrode of the driving transistor T1, and the first electrode of the second reset transistor T7 is connected with the second initialization signal line INT2, and the second electrode of the second reset transistor T7 is connected with the first electrode 201 of the light-emitting element 20. For example, as illustrated in FIG. 3, the gate electrode of the first reset transistor T6 is connected with the first reset control signal line RT1, and the gate electrode of the second reset transistor T7 is connected with the second reset control signal line RT2.

As illustrated in FIG. 3, the pixel circuit 10 further includes a data writing transistor T2, a threshold compensation transistor T3, a first light-emitting control transistor T4, a second light-emitting control transistor T5, a first reset transistor T6, a second reset transistor T7, and a storage capacitor Cst. Compared with the display panel illustrated in FIG. 1, in the display panel illustrated in FIG. 3, the first electrode of the first reset transistor T6 and the first electrode of the second reset transistor T7 are connected with the first initialization signal line INT1 and the second initialization signal lines INT2, respectively, so as to input the first initialization signal Vinit1 and the second initialization signal Vinit2, respectively.

As illustrated in FIG. 3, the first power supply terminal VDD is configured to supply a first voltage signal ELVDD to the pixel circuit 10; the pixel circuit further includes a storage capacitor Cst, and the first electrode Ca of the storage capacitor Cst is connected with the gate electrode T10 of the driving transistor T1, and the second electrode Cb of the storage capacitor Cst is connected with the first power supply terminal VDD.

For example, as illustrated in FIG. 3, the display panel further includes a gate line GT and a data line DT. The gate line is configured to supply a scan signal SCAN to the pixel circuit 10, and the data line DT is configured to supply a data signal DATA (data voltage VDATA) to the pixel circuit 10.

For example, as illustrated in FIG. 3, the pixel circuit 10 further includes a data writing transistor T2. The gate electrode T20 of the data writing transistor T2 is connected with the gate line GT, and the first electrode T21 of the data writing transistor T2 is connected with the data line DT. The second electrode T22 of the data writing transistor T2 is connected with the first electrode T11 of the driving transistor T1.

For example, as illustrated in FIG. 3, the pixel circuit 10 further includes a threshold compensation transistor T3, the gate electrode T30 of the threshold compensation transistor T3 is connected with the gate line GT, the first electrode T31 of the threshold compensation transistor T3 is connected with the second electrode T12 of the driving transistor T1, the second electrode T32 of the threshold compensation transistor T3 is connected with the gate electrode T10 of the driving transistor T1.

For example, as illustrated in FIG. 3, the display panel further includes a light-emitting control signal line EML, the pixel circuit 10 also includes a first light-emitting control transistor T4 and a second light-emitting control transistor T5, the gate electrode T40 of the first light-emitting control transistor T4 is connected with the light-emitting control signal line EML, the first electrode T41 of the first light-emitting control transistor T4 is connected with the first power supply terminal VDD, and the second electrode T42 of the first light-emitting control transistor T4 is connected with the first electrode T11 of the driving transistor T1; the gate electrode T50 of the transistor T5 is connected with the light-emitting control signal line EML, the first electrode T51 of the second light-emitting control transistor T5 is connected with the second electrode T12 of the driving transistor T1, and the second electrode T52 of the second light-emitting control transistor T5 is connected with the first electrode 201 of the light-emitting element 20. For example, the first electrode T41 of the first light-emitting control transistor T4 is connected with the first power supply terminal VDD through the first power line VDD1 (referring to FIG. 10 and FIG. 11).

For example, as illustrated in FIG. 3, the display panel further includes a second power supply terminal VSS which is connected with the second electrode 201 of the light-emitting element 20.

For example, as illustrated in FIG. 4, the first initialization signal line INT1 is configured to supply an alternating current (AC) signal, and the first initialization signal line INT1 is configured to supply a first voltage V1 to the first reset transistor T6 in the phase of resetting the gate electrode of the driving transistor T1, and configured to supply a second voltage V2 to the first reset transistor T6 in the light-emitting phase of the light-emitting element, and the second voltage V2 is greater than the first voltage V1. For example, the second voltage V2 is a positive voltage and the first voltage is a negative voltage, but it is not limited to this case. As long as the second voltage V2 is greater than the first voltage V1, the flicker problem caused by the current leakage path L1 can be alleviated. For example, the first voltage V1 is about −3V, but it is not limited to this case. For example, the second voltage V2 is about in a range of 1V-3V, but it is not limited to this case.

For example, as illustrated in FIG. 4, the second initialization signal line INT2 is configured to supply a direct current (DC) signal. For example, a DC signal is a constant voltage signal. For example, the DC signal is a constant negative voltage. Further, for example, the DC signal is a voltage signal of about −3V, but it is not limited to this case.

For example, the display panel adopts a pixel circuit design suitable for low frame rate driving. The pixel circuit adopts a first initialization signal line and a second initialization signal line that are insulated from each other, and the signal on the first initialization signal line is designed as a pulse signal. In the light-emitting phase, the first initialization signal Vinit1 is set to be at a high level to alleviate current leakage of the first node N1 through the current leakage path L1 of the first reset transistor T6, so as to alleviate the brightness increase caused by the low grayscale current leakage.

For example, as illustrated in FIG. 4, in the data writing and threshold compensation phase t2, the first reset transistor T6 is supplied with the first voltage V1.

As illustrated in FIG. 4, in the first reset phase t1, the light-emitting control signal EM is set to be a turn-off voltage; the reset control signal RESET is set to be a turn-on voltage; and the scan signal SCAN is set to be a turn-off voltage.

As illustrated in FIG. 4, in the data writing and threshold compensation and second reset phase t2, the light-emitting control signal EM is set to be a turn-off voltage; the reset control signal RESET is set to be a turn-off voltage; and the scan signal SCAN is set to be a turn-on voltage.

As illustrated in FIG. 4, in the light-emitting phase t3, the light-emitting control signal EM is set to be a turn-on voltage; the reset control signal RESET is set to be a turn-off voltage; and the scan signal SCAN is set to be a turn-off voltage.

As illustrated in FIG. 4, both the first voltage signal ELVDD and the second voltage signal ELVSS are constant voltage signals; for example, the second initialization signal Vint2 is between the first voltage signal ELVDD and the second voltage signal ELVSS.

For example, in the embodiment of the present disclosure, the turn-on voltage refers to a voltage that can cause a first electrode and a second electrode of a corresponding transistor to be connected, and the turn-off voltage refers to a voltage that can cause a first electrode and a second electrode of a corresponding transistor to be disconnected. In the case where the transistor is a transistor of P-type, the turn-on voltage is a low voltage (e.g., 0 V), and the turn-off voltage is a high voltage (e.g., 5 V); in the case where the transistor is a transistor of N-type, the turn-on voltage is a high voltage (e.g., 5 V), and the turn-off voltage is a low voltage (e.g., 0 V). Driving waveforms illustrated in FIG. 4 are all described by taking transistors of P-type as an example, that is, the turn-on voltage is a low voltage (e.g., 0 V), and the turn-off voltage is a high voltage (e.g., 5 V), but it is not limited thereto.

Referring to FIG. 3 and FIG. 4 together, in the first reset phase t1, the light-emitting control signal EM is a turn-off voltage; the reset control signal RESET is a turn-on voltage; and the scan signal SCAN is a turn-off voltage. In this case, the first reset transistor T6 is in a turn-on state; while the second reset transistor T7, the data writing transistor T2, the threshold compensation transistor T3, the first light-emitting control transistor T4, and the second light-emitting control transistor T5 are in a turn-off state. A first initialization signal (an initialization voltage) Vint1 is transmitted to the gate electrode of the driving transistor T1 by the first reset transistor T6 and then is stored by the storage capacitor C1, so as to reset the driving transistor T1 and eliminate the data stored during emitting light at the last time (a previous frame).

In the data writing and threshold compensation and second reset phase t2, the light-emitting control signal EM is a turn-off voltage; the reset control signal RESET is a turn-off voltage; and the scan signal SCAN is a turn-on voltage. In this case, the data writing transistor T2 and the threshold compensation transistor T3 are in a turn-on state, the second reset transistor T7 is in a turn-on state, and the second reset transistor T7 transmits the second initialization signal Vint2 (the initialization voltage) to the first electrode 201 of the light-emitting element 20 to reset the light-emitting element 20; while the first light-emitting control transistor T4, the second light-emitting control transistor T5, the first reset transistor T6 are in a turn-off state. In this situation, the data writing transistor T2 transmits the data signal voltage VDATA to the first electrode of the driving transistor T1, that is, the data writing transistor T2 receives the scan signal SCAN and the data signal DATA and writes the data voltage VDATA into the first electrode of the driving transistor T1 according to the scan signal SCAN. The threshold compensation transistor T3 is turned on to connect the driving transistor T1 into a diode structure, so that the gate electrode of the driving transistor T1 can be charged. After the charging is completed, a voltage on the gate electrode of the driving transistor T1 is VDATA+Vth, where, VDATA is a data voltage and Vth is a threshold voltage of the driving transistor T1, that is, the threshold compensation transistor T3 receives the scan signal SCAN and performs threshold voltage compensation on the voltage on the gate electrode of the driving transistor T1. In this phase, a voltage difference between both ends of the storage capacitor Cst is ELVDD-VDATA-Vth.

In the light-emitting phase t3, the light-emitting control signal EM is a turn-on voltage; the reset control signal RESET is a turn-off voltage; and the scan signal SCAN is a turn-off voltage. The first light-emitting control transistor T4 and the second light-emitting control transistor T5 are in a turn-on state; while the data writing transistor T2, the threshold compensation transistor T3, the first reset transistor T6, and the second reset transistor T7 are in a turn-off state. The first voltage signal ELVDD is transmitted to the first electrode of the driving transistor T1 through the first light-emitting control transistor T4; the voltage on the gate electrode the driving transistor T1 is maintained at VDATA+Vth; and a light-emitting current I flows into the light-emitting element 20 through the first light-emitting control transistor T4, the driving transistor T1, and the second light-emitting control transistor T5, so that the light-emitting element 20 emits light. That is, the first light-emitting control transistor T4 and the second light-emitting control transistor T5 receive the light-emitting control signal EM, and control the light-emitting element 20 to emit light according to the light-emitting control signal EM. The light-emitting current I satisfies the following saturation current formula:

$$K(Vgs - Vth)^2 = K(VDATA + Vth - ELVDD - Vth)^2 = K(VDATA - ELVDD)^2$$

Where, $$K = 0.5\mu_n Cox \frac{W}{L},$$

$\mu_n$ is channel mobility of the driving transistor, Cox is a channel capacitance per unit area of the driving transistor T1, W and L are a channel width and a channel length of the driving transistor T1, respectively, and Vgs is a voltage difference between the gate electrode and the source electrode (i.e., the first electrode of the driving transistor T1 according to this embodiment) of the driving transistor T1.

It can be seen from the above formula that, the current flowing through the light-emitting element 20 is independent of the threshold voltage of the driving transistor T1. Therefore, the pixel circuit structure well compensates for the threshold voltage of the driving transistor T1.

For example, a ratio of duration of the light-emitting phase t3 to a display time period of one frame may be adjusted. In this way, light-emitting brightness may be controlled by adjusting the ratio of the duration of the light-emitting phase t3 to the display time period of one frame. For example, the ratio of the duration of the light-emitting phase t3 to the display time period of one frame is adjusted by controlling the scan driving circuit in the display panel or a driving circuit additionally provided.

As illustrated in FIG. 3 and FIG. 4, in the light-emitting phase t3, the potential of the first initialization signal Vinit1 is increased to reduce the leakage current of the first node N1 and alleviate the display flicker problem.

For example, the embodiments of the present disclosure are not limited to the specific pixel circuit illustrated in FIG. 1, and other pixel circuits that can realize compensation for the driving transistor can be used. Based on the description and teaching of the implementation manner in the present disclosure, other setting manners that easily occur to a person of ordinary skill in the art without creative work also fall within the protection scope of the present disclosure.

Figure 5:
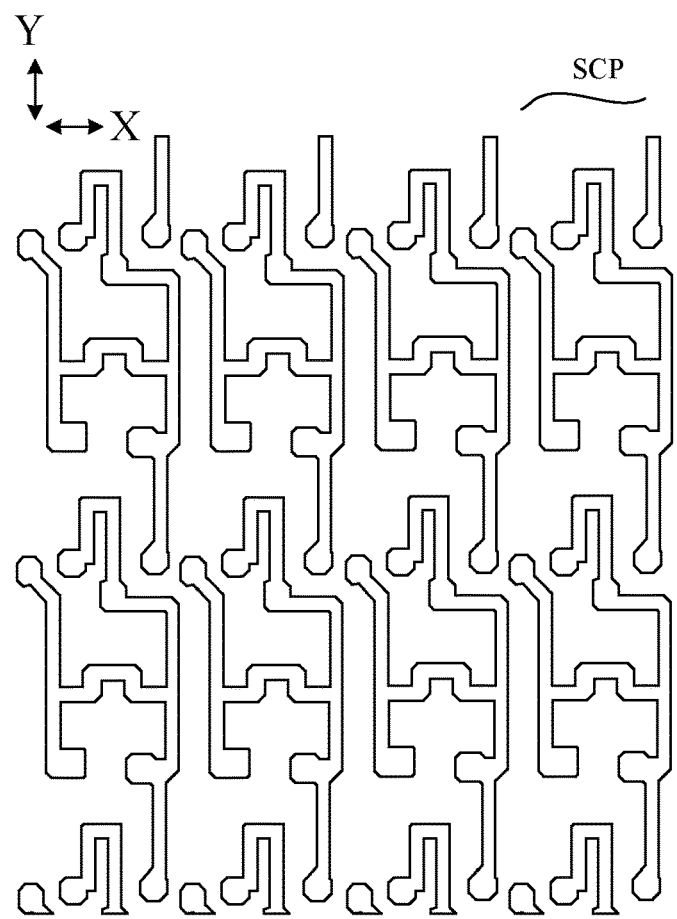
FIG. 5 is a plan view of a semiconductor pattern in a display panel provided by an embodiment of the present disclosure.
Figure 6:
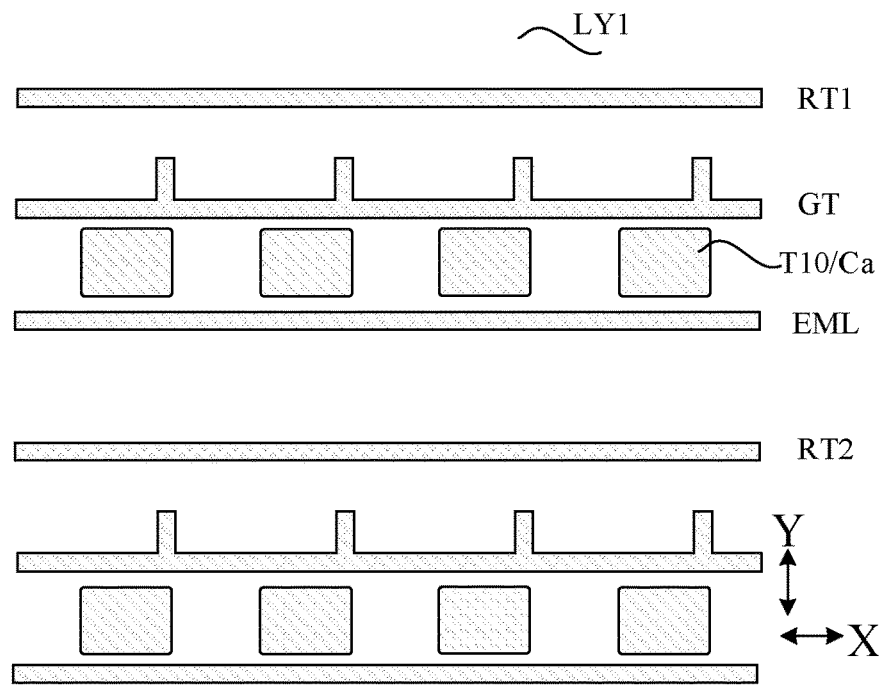
FIG. 6 is a plan view of a first conductive pattern layer in a display panel provided by an embodiment of the present disclosure.
Figure 7:
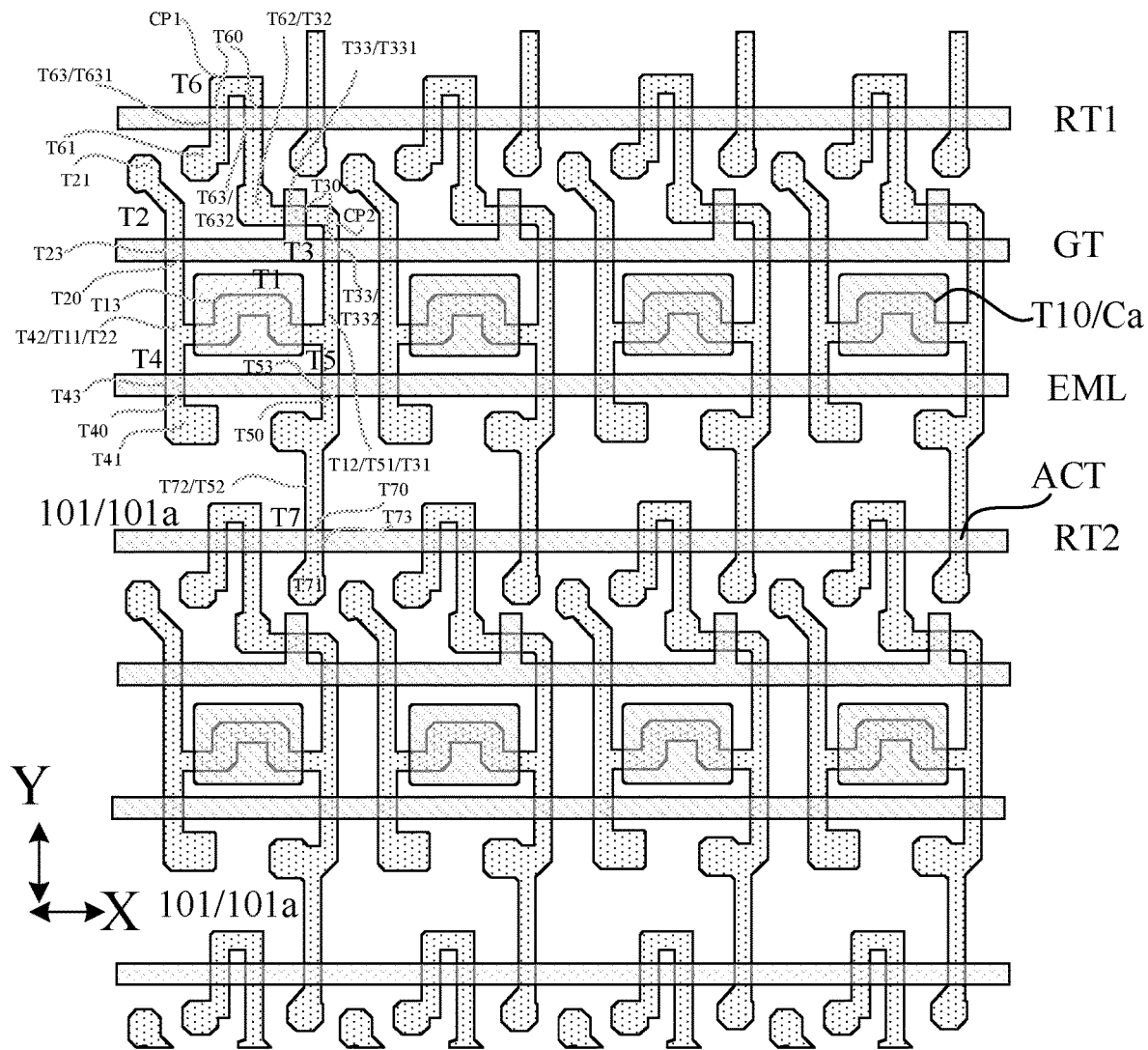
FIG. 7 is a schematic diagram of an active layer, a source electrode, and a drain electrode of a thin film transistor formed in a display panel according to an embodiment of the present disclosure.
Figure 8:
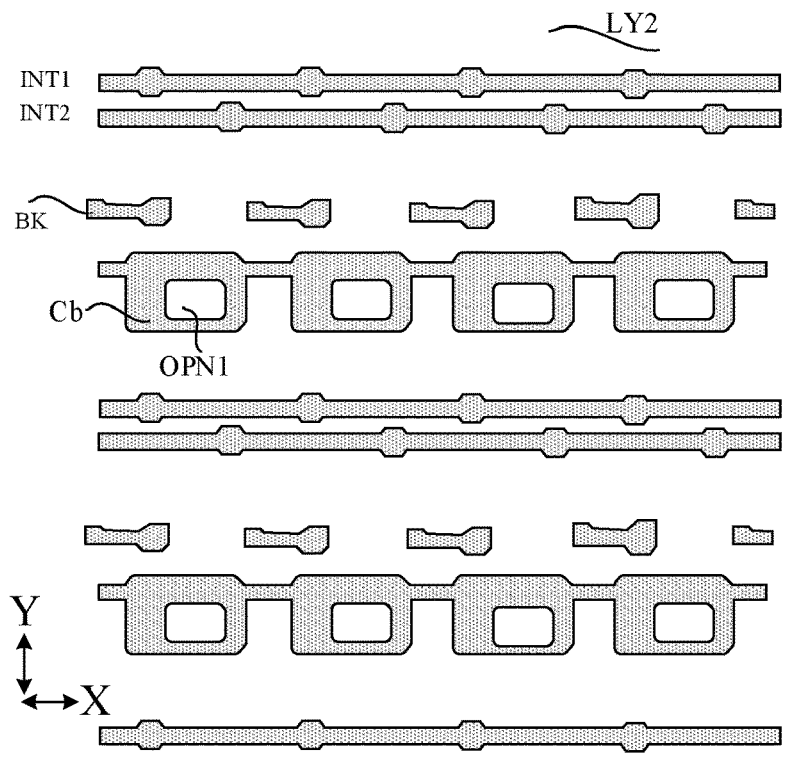
FIG. 8 is a plan view of a second conductive pattern layer in a display panel provided by an embodiment of the present disclosure.
Figure 9:
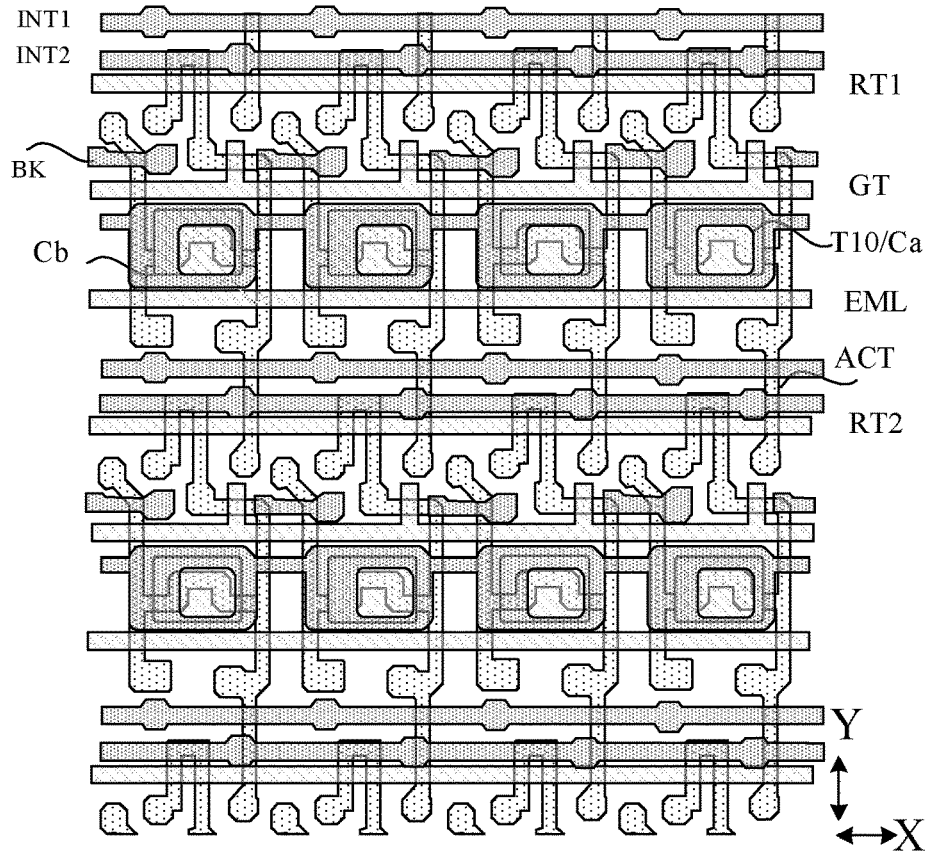
FIG. 9 is a schematic plan view of a display panel after forming the second conductive pattern layer according to an embodiment of the present disclosure.
Figure 10:
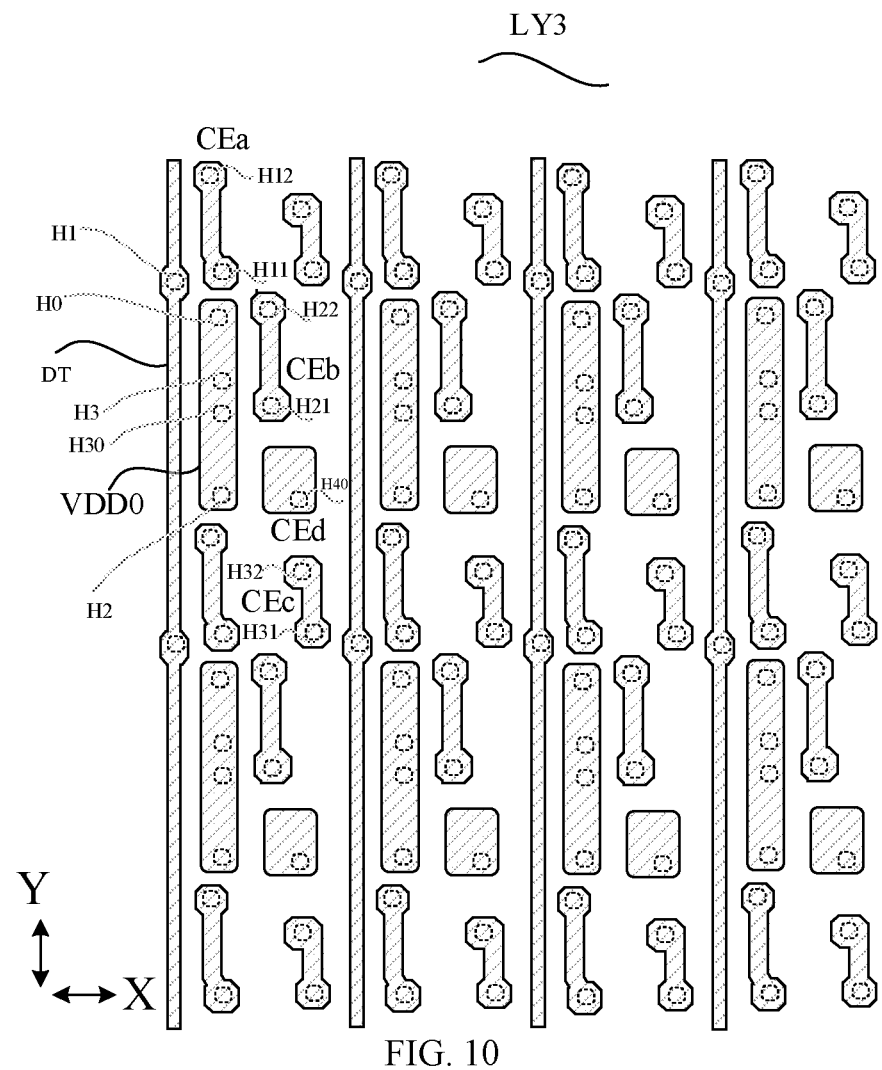
FIG. 10 is a plan view of a third conductive pattern layer in a display panel provided by an embodiment of the present disclosure.
Figure 11:
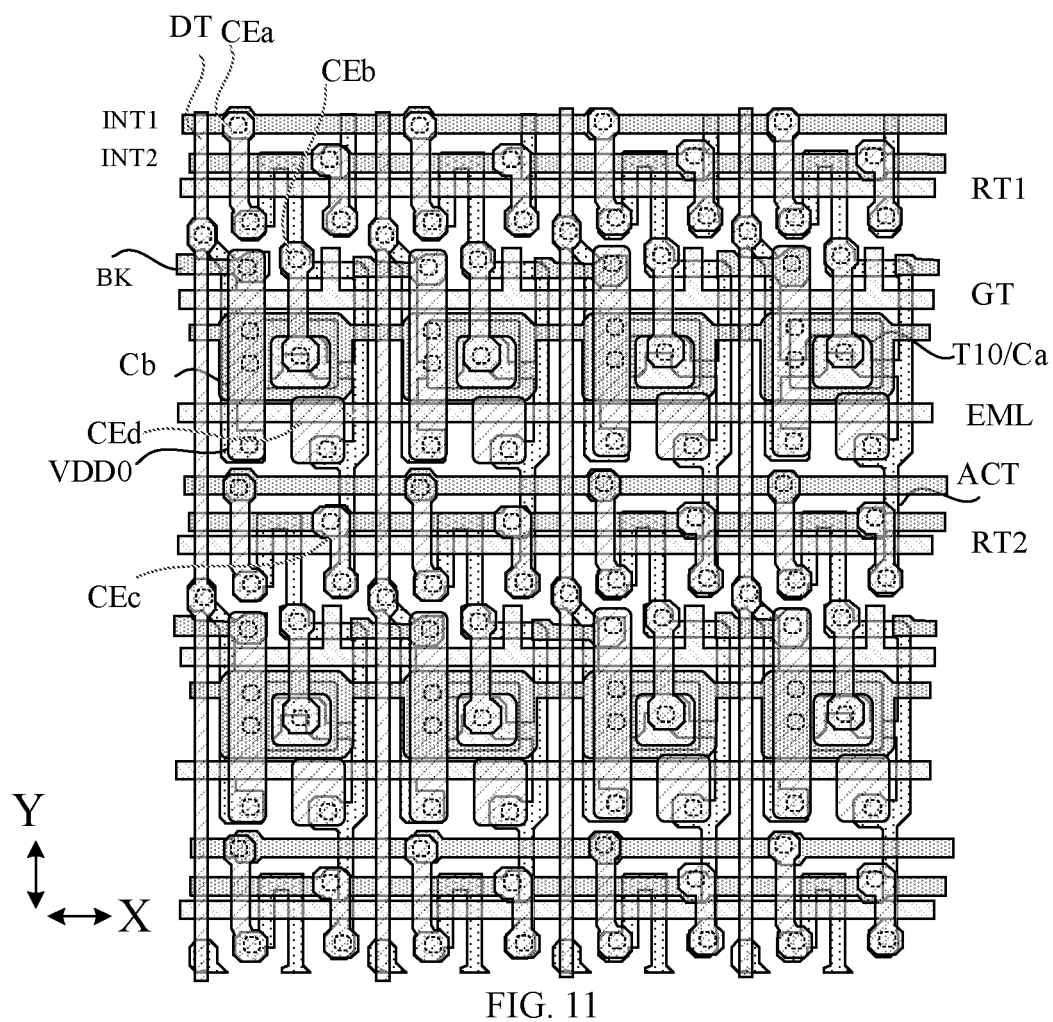
FIG. 11 is a schematic plan view of a display panel after forming the third conductive pattern layer according to an embodiment of the present disclosure.
Figure 12:
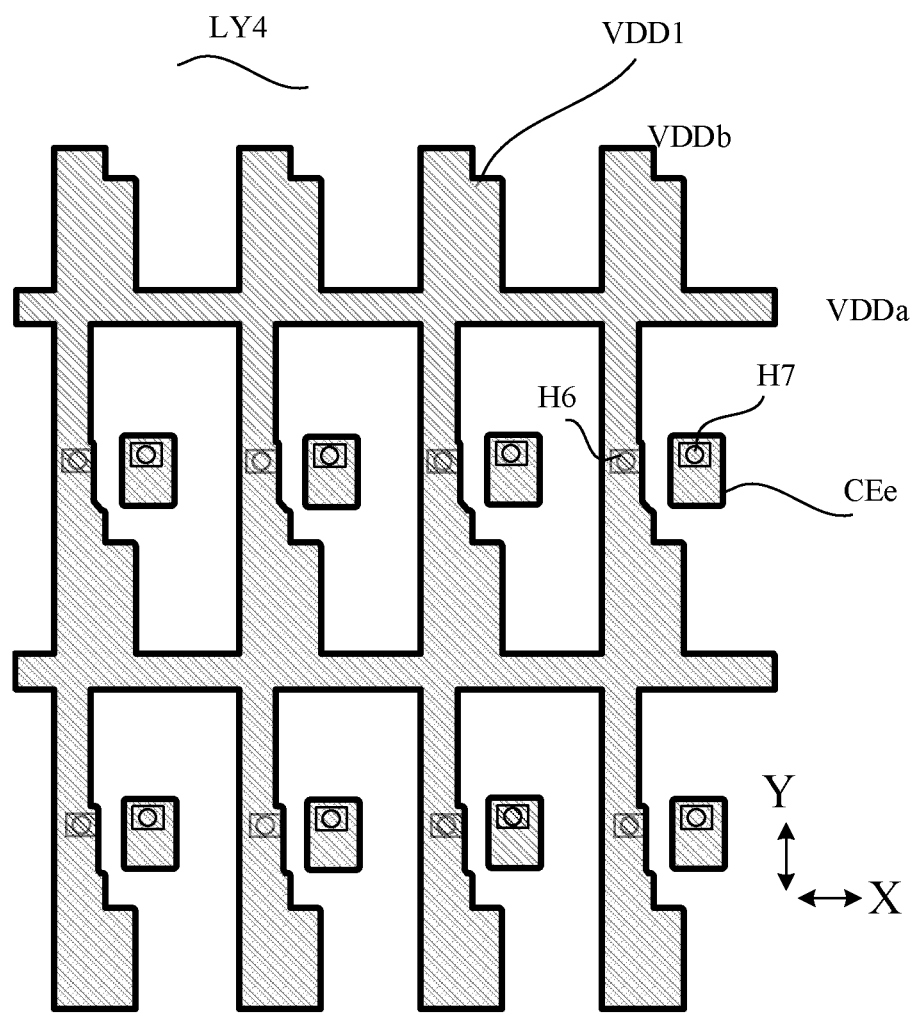
FIG. 12 is a plan view of a fourth conductive pattern layer in a display panel provided by an embodiment of the present disclosure.
Figure 13:
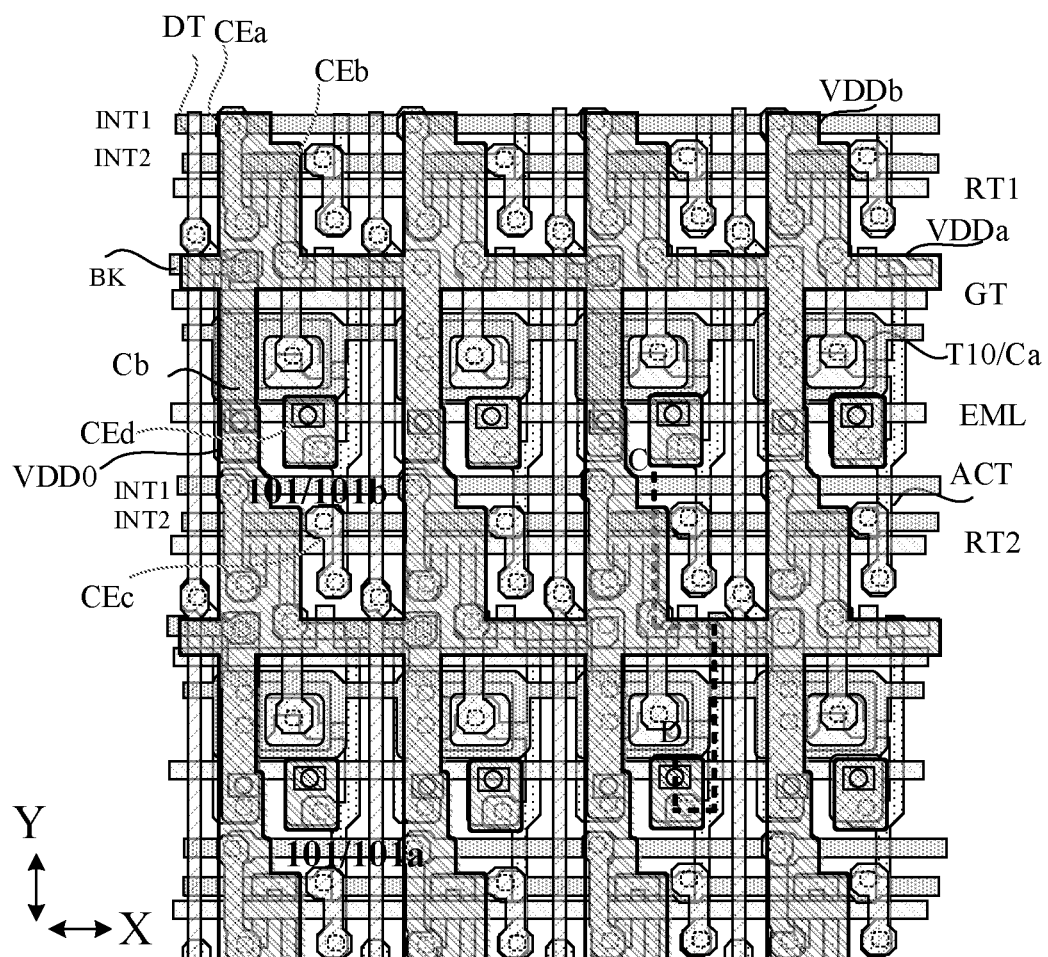
FIG. 13 is a schematic plan view after forming the fourth conductive pattern layer in a display panel provided by an embodiment of the present disclosure.
Figure 14:
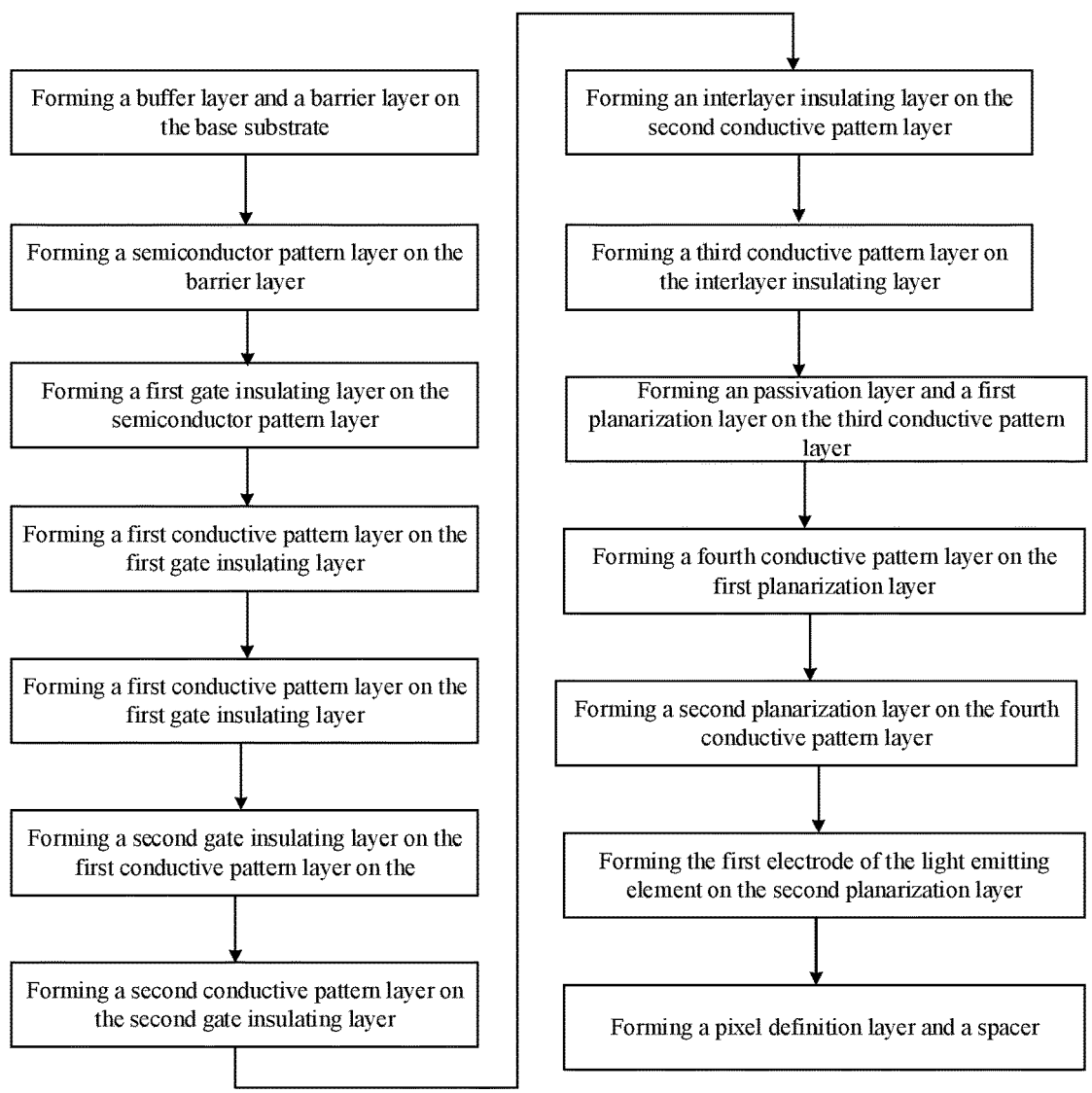
FIG. 14 is a flowchart of a manufacturing method of a display panel provided by an embodiment of the present disclosure.
Figure 15:
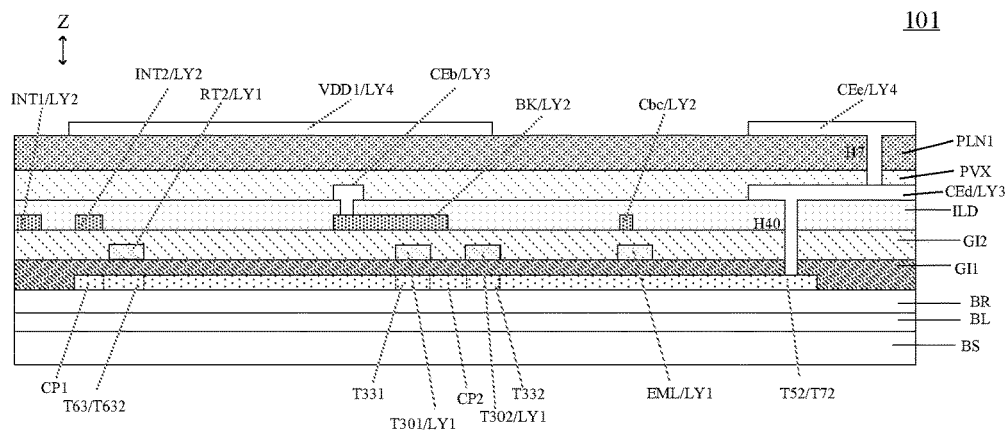
FIG. 15 is a partial cross-sectional view of a display panel provided by an embodiment of the present disclosure.

Hereinafter, the display panel provided by the embodiment of the present disclosure will be described with reference to FIG. 5 to FIG. 15. FIG. 5 is a plan view of a semiconductor pattern in a display panel provided by an embodiment of the present disclosure. FIG. 6 is a plan view of a first conductive pattern layer in a display panel provided by an embodiment of the present disclosure. FIG. 7 is a schematic diagram of an active layer, a source electrode, and a drain electrode of a thin film transistor formed in a display panel provided by an embodiment of the present disclosure. FIG. 8 is a plan view of a second conductive pattern layer in a display panel provided by an embodiment of the present disclosure. FIG. 9 is a schematic plan view of a display panel after forming the second conductive pattern layer according to an embodiment of the present disclosure. FIG. 10 is a plan view of a third conductive pattern layer in a display panel provided by an embodiment of the present disclosure. FIG. 11 is a schematic plan view of a display panel after forming the third conductive pattern layer according to an embodiment of the present disclosure. FIG. 12 is a plan view of a fourth conductive pattern layer in a display panel provided by an embodiment of the present disclosure. FIG. 13 is a schematic plan view of a display panel after forming the fourth conductive pattern layer according to an embodiment of the present disclosure. FIG. 14 is a flowchart of a manufacturing method of a display panel provided by an embodiment of the present disclosure. FIG. 15 is a partial cross-sectional view of a display panel provided by an embodiment of the present disclosure. In the embodiments of the present disclosure, for the sake of clarity, the insulating layer is illustrated in the form of via holes in the plan view, the insulating layer itself is transparentized, and the first conductive pattern layer, the second conductive pattern layer, and the third conductive pattern layer, and the fourth conductive pattern layer have been translucent. For example, FIG. 15 is a cross-sectional view of FIG. 13 taken along the line C-D.

FIG. 5 illustrates the semiconductor pattern SCP, and FIG. 6 illustrates the first conductive pattern layer LY1. For example, a first gate insulating layer (the first gate insulating layer GI1, referring to FIG. 15) is between the first conductive pattern layer LY1 and a semiconductor pattern SCP. As illustrated in FIG. 6, the first conductive pattern layer LY1 includes a first reset control signal line RT1, a gate line GT, a first electrode Ca of a storage capacitor Cst (the gate electrode T10 of the driving transistor T1), a light-emitting control signal line EML, and a second reset control signal line RT2. A doping process is performed on the semiconductor pattern SCP with the first conductive pattern layer LY1 as a mask, so that the region of the semiconductor pattern SCP covered by the first conductive pattern layer LY1 retains semiconductor characteristics to form an active layer, while the region of the semiconductor pattern SCP not covered by the first conductive pattern layer LY1 is converted into a conductor to form the source electrode and the drain electrode of the thin film transistor. FIG. 7 illustrates the active layer ACT formed after the semiconductor pattern SCP is partially converted into a conductor. For example, in the embodiment of the present disclosure, the gate line GT of the present row is connected with the reset control signal line of a next row. For example, the gate line GT and the second reset control signal line RT2 may be electrically connected with each other so as to supply the same signal at the same time.

For example, as illustrated in FIG. 7, in the manufacturing process of the display substrate, a self-alignment process is used to perform a conducting process on the semiconductor pattern layer SCP with the first conductive pattern layer LY1 as a mask. For example, an ion implantation process is used to perform a heavily doping process on the semiconductor pattern layer SCP, so that the portion of the semiconductor pattern layer SCP that is not covered by the first conductive pattern layer LY1 is converted into a conductor, so as to form the source region (first electrode T11) and the drain region (second electrode T12) of the driving transistor T1, the source region (first electrode T21) and drain region (second electrode T22) of the data writing transistor T2, the source region (first electrode T31) and drain region (second electrode T32) of the threshold compensation transistor T3, the source region (first electrode T41) and the drain region (second electrode T42) of the first light-emitting control transistor T4, the source region (first electrode T51) and the drain region (second electrode T52) of the second light-emitting control transistor T5, the source region (first electrode T61) and the drain region (second electrode T62) of the first reset transistor T6, and the source region (first electrode T71) and the drain region (second electrode T72) of the second reset transistor T7. The portion of the semiconductor pattern layer SCP that is covered by the first conductive pattern layer L1 retains semiconductor characteristics, so as to form the channel region T13 of the driving transistor T1, the channel region T23 of the data writing transistor T2, and the channel region T33 of the threshold compensation transistor T3, the channel region T43 of the first light-emitting control transistor T4, the channel region T53 of the second light-emitting control transistor T5, the channel region T63 of the first reset transistor T6, and the channel region T73 of the second reset transistor T7. The channel region of each transistor constitutes the active layer ACT (refer to FIG. 7).

For example, as illustrated in FIG. 7, the second electrode T72 of the second reset transistor T7 and the second electrode T52 of the second light-emitting control transistor T5 are integrally formed; the first electrode T51 of the second light-emitting control transistor T5, the second electrode T12 of the driving transistor T1, and the first electrode T31 of the threshold compensation transistor T3 are integrally formed; the first electrode T11 of the driving transistor T1, the second electrode T22 of the data writing transistor T2, and the second electrode T42 of the first light-emitting control transistor T4 are integrally formed; the second electrode T32 of the threshold compensation transistor T3 and the second electrode T62 of the first reset transistor T6 are integrally formed.

For example, the channel regions (active layers) of the transistors used in the embodiment of the present disclosure may be made of monocrystalline silicon, polycrystalline silicon (e.g., low temperature polycrystalline silicon), or metal oxide semiconductor materials (e.g., IGZO, AZO, etc.). In one embodiment, the transistors are all Low Temperature Polycrystalline silicon (LTPS) thin-film transistors of P-type. In another embodiment, the threshold compensation transistor T3 and the first reset transistor T6 that are directly connected with the gate electrode of the driving transistor T1 are metal oxide semiconductor thin-film transistors, that is, channel materials of the transistors are metal oxide semiconductor materials (e.g., IGZO, AZO, etc.); and the metal oxide semiconductor thin-film transistor has a relatively low leakage current, which can help to reduce a leakage current of the gate electrode of the driving transistor T1.

For example, the transistors used in the embodiment of the present disclosure may include various structures, such as a top gate type, a bottom gate type, or a dual-gate structure. In some embodiments, the threshold compensation transistor T3 and the first reset transistor T6 that are directly connected with the gate electrode of the driving transistor T1 are thin-film transistors of a dual-gate structure, which may help to reduce a leakage current of the gate electrode of the driving transistor T1.

For example, as illustrated in FIG. 7, a portion of the light-emitting control signal line EML serves as the gate electrode T40 of the first light-emitting control transistor T4, a portion of the light-emitting control signal line EML serves as the gate electrode T50 of the second light-emitting control transistor T5, and the gate electrode T60 of the first reset transistor T6 is a portion of the first reset control signal line RT1, the gate electrode T70 of the second reset transistor T7 is a portion of the second reset control signal line RT2, and the gate electrode T20 of the data writing transistor T2 is a portion of the gate line GT, the gate electrode T30 of the threshold compensation transistor T3 is a portion of the gate line GT.

As illustrated in FIG. 7, the first reset transistor T6 is a dual-gate transistor. The first reset transistor T6 includes a first channel T631 and a second channel T632, and the first channel T631 and the second channel T632 are connected by a first conductive connection portion CP1. The threshold compensation transistor T3 is a dual-gate transistor. The threshold compensation transistor T3 includes a first channel T331 and a second channel T332. The first channel T331 and the second channel T332 are connected by a second conductive connection portion CP2. The first conductive connection portion CP1 is an intermediate node of the first reset transistor T6, and the second conductive connection portion CP2 is an intermediate node of the threshold compensation transistor T3.

FIG. 8 illustrates the second conductive pattern layer LY2. For example, a second gate insulating layer (second gate insulating layer GI2, refer to FIG. 15) is provided between the second conductive pattern layer LY2 and the first conductive pattern layer LY1. The second conductive pattern layer LY2 includes a blocking portion BK, a first initialization signal line INT1, a second initialization signal line INT2, and a second electrode Cb of the storage capacitor Cst. The blocking portion BK can be connected with the first power line VDD1 to supply a constant voltage. The blocking portion BK is configured to cover the second conductive connection portion CP2 between the two channels of the threshold compensation transistor T3. The blocking portion BK and the second conductive connection portion CP2 form a capacitor (a stabilization capacitor) to avoid leakage current of the threshold compensation transistor T3 so as to avoid affecting the display effect. The first power line VDD1 is connected with the first power supply terminal VDD, and the first power line VDD1 is configured to supply the pixel circuit 10 with the first voltage signal ELVDD. The second electrode Cb of the storage capacitor Cst is connected with the first power line VDD1. For example, the second electrode Cb of the storage capacitor Cst is connected with the first power supply terminal VDD through the first power line VDD1.

As illustrated in FIG. 10, the third conductive pattern layer LY3 includes a data line DT, a power connection line VDD0, a first connection electrode CEa, a second connection electrode CEb, a third connection electrode CEc, and a fourth connection electrode CEd. An interlayer insulating layer (an interlayer insulating layer ILD, referring to FIG. 15) is provided between the third conductive pattern layer LY3 and the second conductive pattern layer LY2. Referring to FIG. 9-FIG. 11, the data line DT is electrically connected with the first electrode T21 of the data writing transistor T2 through the via hole H1, and the power connection line VDD0 is electrically connected with the first electrode T41 of the first light-emitting control transistor T4 through the via hole H2. The power connection line VDD0 is electrically connected with the second electrode Cb of the storage capacitor Cst through the via holes H3 and H30, and the power connection line VDD0 is electrically connected with the conductive blocking portion BK through the via hole H0. One end of the first connection electrode CEa is electrically connected with the first initialization signal line INT1 through the via hole H12, and the other end of the first connection electrode CEa is connected with the first electrode T61 of the first reset transistor T6 through the via hole H11, so that the first electrode T61 of the reset transistor T6 is electrically connected with the first initialization signal line INT1. One end of the second connection electrode CEb is electrically connected with the second electrode T62 of the first reset transistor T6 through a via hole H22, and the other end of the second connection electrode CEb is electrically connected with the gate electrode T10 (that is, the first electrode Ca of the storage capacitor Cst) of the driving transistor T1 through a via hole H21, so that the second electrode T62 of the first reset transistor T6 is electrically connected with the gate electrode T10 (that is, the first electrode Ca of the storage capacitor Cst) of the driving transistor T1. One end of the third connection electrode CEc is electrically connected with the second initialization signal line INT2 through the via hole H32, and the other end of the third connection electrode CEc is connected with the first electrode T71 of the second reset transistor T7 through the via hole H31, so that the first electrode T71 of the second reset transistor T7 is electrically connected with the second initialization signal line INT2. The fourth connection electrode CEd is electrically connected with the second electrode T52 of the second light-emitting control transistor T5 through the via hole H40. The fourth connection electrode CEd can be used to connect to the fifth connection electrode CEe formed later, and then to be electrically connected with the first electrode 201 (refer to FIG. 17) of the light-emitting element 20.

FIG. 12 illustrates the fourth conductive pattern layer LY4. The fourth conductive pattern layer LY4 includes the fifth connection electrode CEe and the first power line VDD1. A passivation layer (a passivation layer PVX, referring to FIG. 15) and a first planarization layer (a first planarization layer PLN1, referring to FIG. 15) are provided between the third conductive pattern layer LY3 and the fourth conductive pattern layer LY4. The first power line VDD1 is connected with the power connection line VDD0 through the via hole H6 penetrating the passivation layer and the first planarization layer, and the fifth connection electrode CEe is connected with the fourth connection electrode CEd through the via hole H7 penetrating the passivation layer and the first planarization layer. FIG. 13 illustrates a plan view of the structure after forming the fourth conductive pattern layer LY4.

FIG. 5 to FIG. 13 illustrates a first direction X and a second direction Y, and the second direction Y intersects with the first direction X. For example, the embodiment of the present disclosure is described with reference to the case where the first direction X is perpendicular to the second direction Y. For example, the first direction X is the row direction of the pixel unit, and the second direction Y is the column direction of the pixel unit. In FIG. 13, each fifth connection electrode CEe is connected with one light-emitting element, that is, each fifth connection electrode CEe corresponds to one pixel unit 101.

For example, referring to FIG. 8, FIG. 9, FIG. 11, and FIG. 13, the first initialization signal line INT1 and the second initialization signal line INT2 are extended substantially in the same direction. For example, the first initialization signal line INT1 and the second initialization signal line INT2 are arranged in the second direction Y and extended in the first direction X.

For example, referring to FIG. 7 and FIG. 13, the first initialization signal line INT1 and the second initialization signal line INT2 are both extended in the first direction X, and the light-emitting unit 101 includes a first light-emitting unit 101a and a second light-emitting unit 101b that are adjacent to each other in the second direction Y. In the second direction Y, the second initialization signal line INT2 of the second light-emitting unit 101b and the first initialization signal line INT1 of the first light-emitting unit 101a are located between the driving transistor T1 of the first light-emitting unit 101a and the driving transistor T1 of the second light-emitting unit 101b. The second initialization signal line INT2 of the second light-emitting unit 101b is closer to the driving transistor T1 of the first light-emitting unit 101a than the first initialization signal line INT1 of the first light-emitting unit 101a.

For example, referring to FIG. 11, FIG. 13 and FIG. 15, an orthographic projection of the first conductive connection portion CP1 of the first reset transistor T6 of the first light-emitting unit 101a on the base substrate BS at least partially falls within an orthographic projection of the second initialization signal line INT2 of the first light-emitting unit 101b on the base substrate BS. Because the voltage on the second initialization signal line INT2 is a constant voltage in the light-emitting phase, a first stabilization capacitor C1 is formed between the second initialization signal line INT2 and the first conductive connection portion CP1 to shield the intermediate node of the first reset transistor T6, so as to reduce the impact of the change of the first initialization signal Vinit1 on the intermediate node of the first reset transistor T6, thereby reducing the leakage current of the intermediate node of the first reset transistor T6, alleviating the display flicker problem caused by the leakage current, and improving display quality.

For example, referring to FIG. 7, FIG. 11, FIG. 13, and FIG. 15, orthographic projections of the first gate electrode T601 and the second gate electrode T602 of the first reset transistor T6 on the base substrate BS overlap with orthographic projections of the first channel T631 and the second channel T632 of the first reset transistor T6 on the base substrate BS, respectively.

For example, as illustrated in FIG. 10 and FIG. 11, the display panel includes a plurality of power connection lines VDD0, the plurality of power connection lines VDD0 are arranged in an array, and one first connection electrode CEa is located between two power connection lines VDD0 adjacent in the second direction Y. In other words, a power connection line VDD0 is provided between two first connection electrodes CEa adjacent in the second direction Y.

For example, as illustrated in FIG. 12 and FIG. 13, the first power line VDD1 is connected with the second electrode Cb of the storage capacitor Cst through the power connection line VDD0.

For example, as illustrated in FIG. 12 and FIG. 13, the first power line VDD1 has a grid shape, and includes a first portion VDDa extended in a first direction X and a second portion VDDb extended in a second direction Y. The first portion VDDa intersects with the second portion VDDb. For example, the first portion VDDa and the second portion VDDb are integrally formed.

For example, referring to FIG. 13 and FIG. 15, in order to reduce the leakage current of the first reset transistor, an orthographic projection of the first power line VDD1 on the base substrate BS at least partially overlaps with an orthographic projection of the first conductive connection portion CP1 on the base substrate BS.

For example, referring to FIG. 13 and FIG. 15, in order to further reduce the leakage current of the first reset transistor, the orthographic projection of the first conductive connection portion CP1 on the base substrate BS completely falls within the orthographic projection of the first power line VDD1 on the base substrate BS.

For example, referring to FIG. 13 and FIG. 15, the gate electrode T10 of the driving transistor T1 is connected with the second electrode T62 of the first reset transistor T6 through a connecting line (the second connection electrode CEb). In order to reduce the impact of the voltage jump of the data line on the gate electrode T10 of the driving transistor T1, the orthographic projection of the first power line VDD1 on the base substrate BS at least partially overlaps with the orthographic projection of the connecting line (the second connection electrode CEb) on the base substrate BS. For example, the orthographic projection of the connection line (the second connection electrode CEb) on the base substrate BS at least partially falls within the orthographic projection of the first power line VDD1 on the base substrate B S.

For example, referring to FIG. 13 and FIG. 15, the threshold compensation transistor T3 is a dual-gate transistor. In order to reduce the leakage of the threshold compensation transistor T3, the orthographic projection of the first power line VDD1 on the base substrate BS at least partially overlaps with the orthographic projection of the second conductive connection portion CP2 on the base substrate BS. A stabilization capacitance is formed between the first power line VDD1 and the second conductive connection part CP2.

For example, referring to FIG. 13 and FIG. 15, in order to minimize the leakage of the threshold compensation transistor T3, the orthographic projection of the second conductive connection portion CP2 on the base substrate BS completely falls within the orthographic projection of the first power line VDD1 on the base substrate BS.

Figure 16:
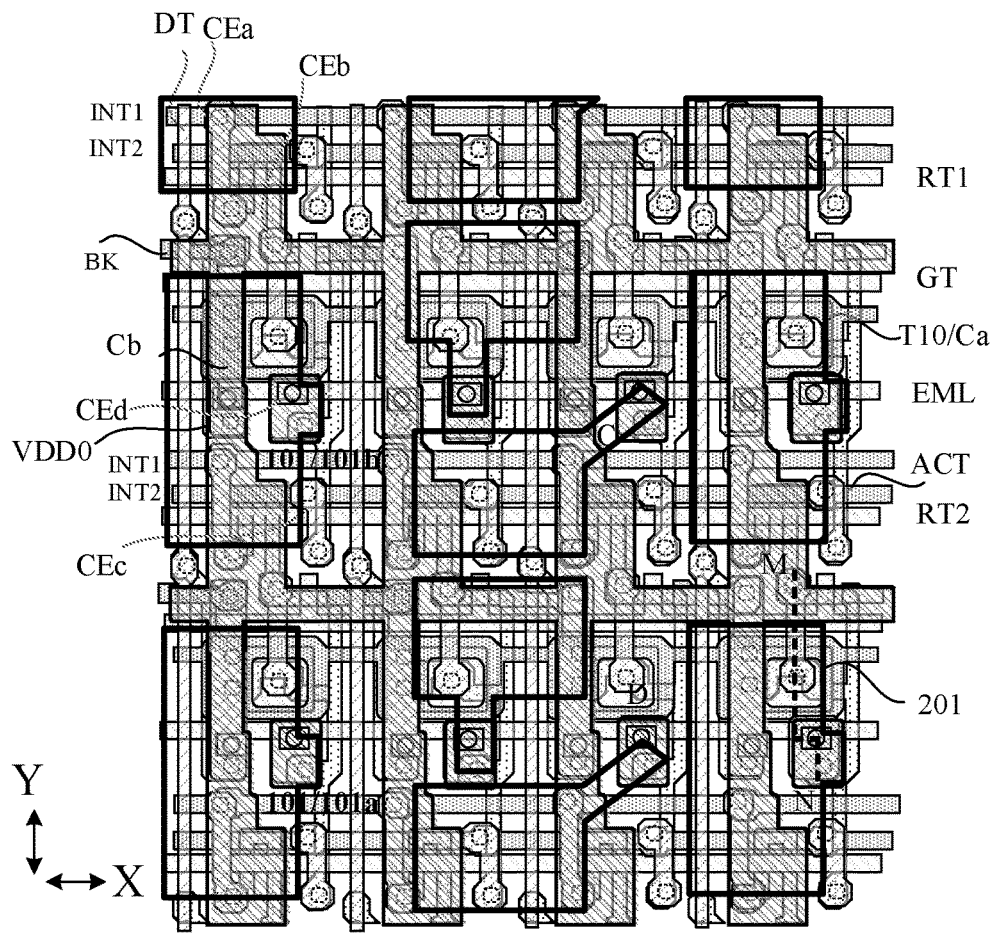
FIG. 16 is a plan view of a display panel provided by an embodiment of the present disclosure.
Figure 17:
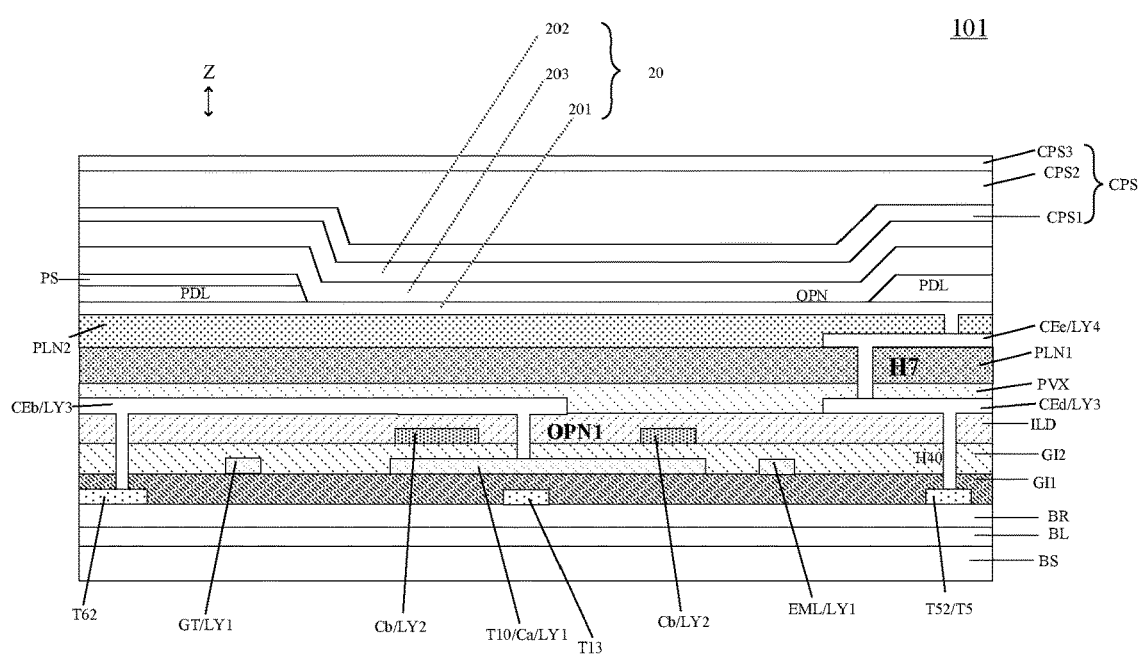
FIG. 17 is a cross-sectional view of a display panel provided by an embodiment of the present disclosure.

FIG. 16 is a plan view of a display panel provided by an embodiment of the present disclosure. FIG. 16 illustrates the first electrode 201 of the light-emitting element. FIG. 17 is a cross-sectional view of a display panel provided by an embodiment of the present disclosure. For example, FIG. 17 is a cross-sectional view of FIG. 16 taken along line M-N. The film layer on the first electrode 201 of the light-emitting element is omitted in FIG. 16. Of course, the arrangement and shape of the first electrode 201 of the light-emitting element are not limited to the case illustrated in FIG. 16, and those skilled in the art can adjust the arrangement and shape of the first electrode 201 of the light-emitting element as required.

FIG. 15 and FIG. 17 illustrate the third direction Z, the third direction Z is a direction perpendicular to the base substrate BS, the third direction Z is perpendicular to the first direction X, and the third direction Z is perpendicular to the second direction Y.

Referring to FIG. 15 and FIG. 17, a buffer layer BL is located on the base substrate BS, the barrier BR is located on the buffer layer BL, the channel region, the source electrode and the drain electrode of the transistor are located on the barrier BR, a first gate insulating layer GI1 is formed on the source and drain electrodes, the first conductive pattern layer LY1 is located on the first gate insulating layer GI1, the second gate insulating layer GI2 is located on the first conductive pattern layer LY1, and the second conductive pattern layer LY2 is located on the second gate insulating layer GI2, an interlayer insulating layer ILD is located on the second conductive pattern layer LY2, the third conductive pattern layer LY3 is located on the interlayer insulating layer ILD, and a passivation layer PVX is located on the first conductive pattern layer LY1, the first planarization layer PLN1 is located on the passivation layer PVX, and the fourth conductive pattern layer LY4 is located on the first planarization layer PLN1.

Referring to FIG. 17, a second planarization layer PLN2 is located on the fourth conductive pattern layer LY4, the first electrode 201 of the light-emitting element 20 is located on the second planarization layer PLN2, and a pixel definition layer PDL and a spacer PS are located on the second planarization layer PLN2, the pixel definition layer PDL has an opening OPN, and the opening OPN is configured to define a light-emitting area (light-emitting area, effective light-emitting area) of the pixel unit. The spacer PS is configured to support a fine metal mask when the light-emitting functional layer 203 is formed.

For example, the opening OPN is the light-emitting area of the light-emitting unit. The light-emitting functional layer 203 is located on the first electrode 201 of the light-emitting element 20, the second electrode 202 of the light-emitting element 20 is located on the light-emitting functional layer 203, and an encapsulation layer CPS is provided on the light-emitting element 20. The encapsulation layer CPS includes a first encapsulation layer CPS1, a second encapsulation layer CPS2, and a third encapsulation layer CPS3. For example, the first encapsulation layer CPS1 and the third encapsulation layer CPS3 are inorganic material layers, and the second encapsulation layer CPS2 is an organic material layer. For example, the first electrode 201 is the anode of the light-emitting element 20, and the second electrode 202 is the cathode of the light-emitting element 20, but it is not limited thereto.

For example, the light-emitting element 20 includes an organic light-emitting diode. The light-emitting functional layer 203 is located between the second electrode 202 and the first electrode 201. The second electrode 202 is located on the side of the first electrode 201 facing away from the base substrate BS. The light-emitting functional layer 203 includes at least a light-emitting layer, and may also include at least one selected from the group consisting of a hole transport layer, a hole injection layer, an electron transport layer, and an electron injection layer.

As illustrated in FIG. 8 and FIG. 17, the second electrode Cb of the storage capacitor has an opening OPN1, and the opening OPN1 is arranged to facilitate the connection of the second connection electrode CEb and the gate electrode T10 of the driving transistor T1. FIG. 15 illustrates the connecting portion Cbs which is used to connect adjacent second electrodes Cb.

Figure 18:
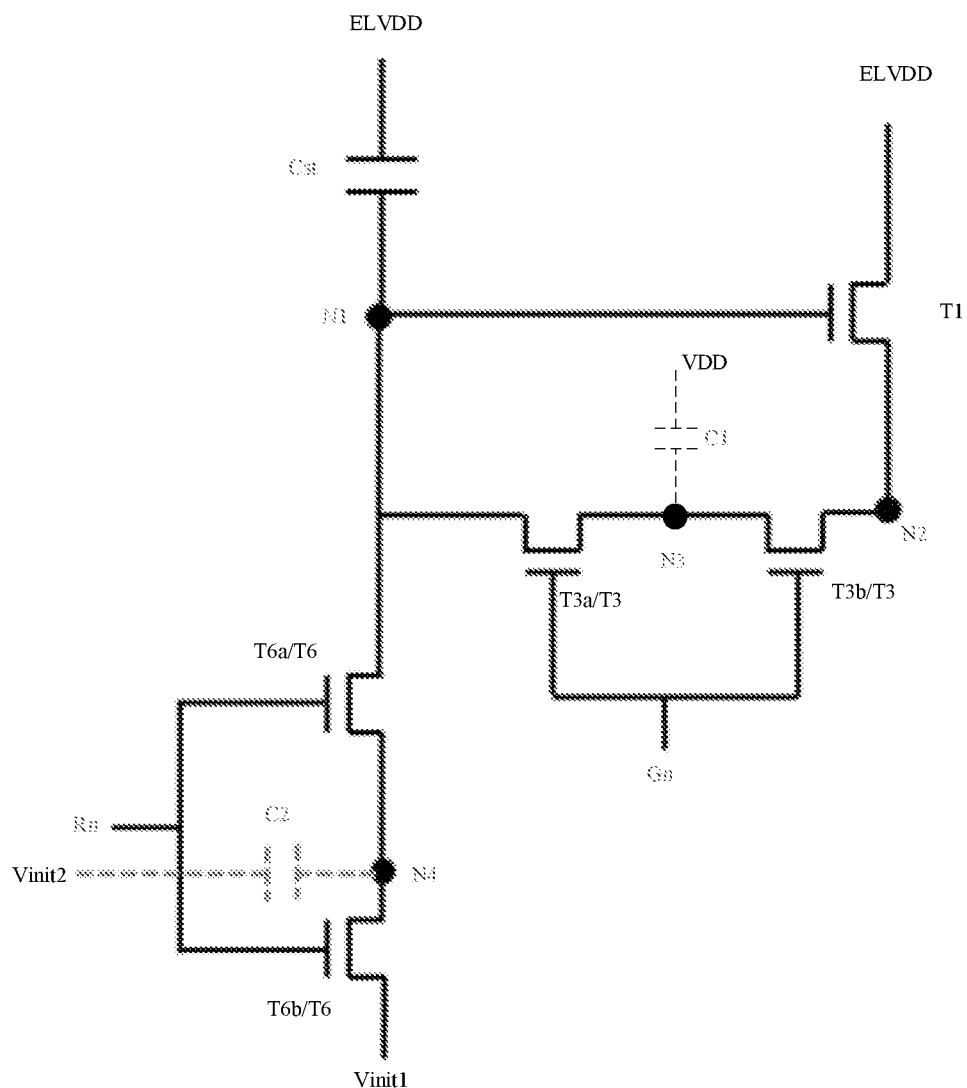
FIG. 18 is a schematic diagram of a partial circuit of a display panel provided by an embodiment of the present disclosure.

FIG. 18 is a schematic diagram of a partial circuit of a display panel provided by an embodiment of the present disclosure. FIG. 18 illustrates the first node N1, the second node N2, the third node N3, and the fourth node N4. The potential of the first node N1 corresponds to the potential of the gate electrode of the driving transistor T1, the potential of the third node N3 corresponds to the potential of the intermediate node (the second conductive connection portion CP2) of the threshold compensation transistor T3, and the potential of the fourth node N4 corresponds to the potential of the intermediate node (first conductive connection portion CP1) of the first reset transistor T6. Referring to FIG. 15 and FIG. 18, the first conductive connection portion CP1 and the second initialization signal line INT2 form a second stabilization capacitor C2 to reduce leakage current. Referring to FIG. 15 and FIG. 18, the second conductive connection portion CP2 and the first power line VDD1 (blocking portion BK) form a first stabilization capacitor C1 to reduce leakage current. As illustrated in FIG. 18, the threshold compensation transistor T3 includes two series-connected sub-TFTs: T3*a* and T3*b*, and the first reset transistor T6 includes two series-connected sub-TFTs: T6*a* and T6*b*.

Figure 19:
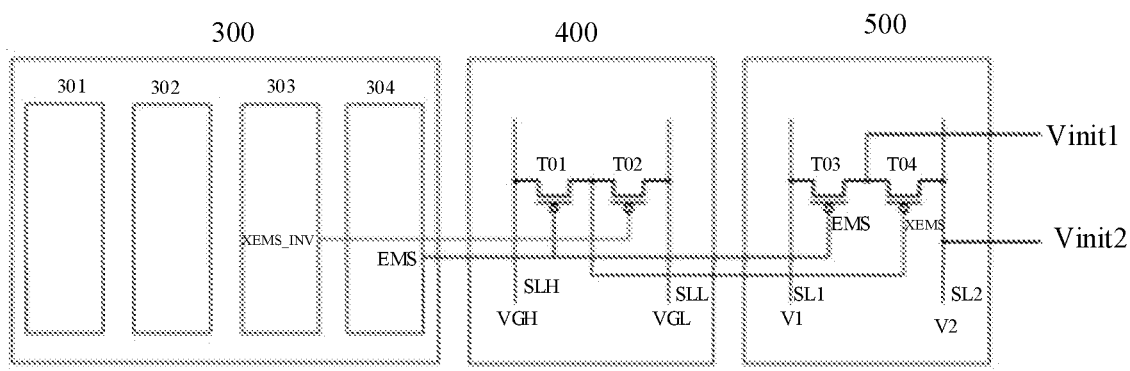
FIG. 19 is a schematic diagram of a circuit for generating dual initialization signals of a display panel provided by an embodiment of the present disclosure.

FIG. 19 is a schematic diagram of a circuit for dynamically generating the first initialization signal and the second initialization signal of the display panel according to an embodiment of the present disclosure. Of course, the circuit for dynamically generating the first initialization signal and the second initialization signal in the embodiment of the present disclosure is not limited to that illustrated in FIG. 19, and circuits of other structures can also be used to dynamically generate the first initialization signal Vinit1 and the second initialization signal Vinit2.

As illustrated in FIG. 19, the circuit for dynamically generating the initialization signal includes a gate driver on array (GOA) unit 300, an inverse switch unit 400, and a dual Vinit switch unit 500.

As illustrated in FIG. 19, the GOA unit 300 includes a gate signal GOA unit 301, a light-emitting signal GOA unit 302, a reset signal GOA unit 303, and a light-emitting signal GOA unit 304. For example, the gate signal GOA unit 301 and the reset signal GOA unit 303 may be the same unit, and the light-emitting signal GOA unit 302 and the light-emitting signal GOA unit 304 may be the same unit.

As illustrated in FIG. 19, the reverse switch unit 400 includes two thin film transistors: TFT T01 and TFT T02. As illustrated in FIG. 19, the dual Vinit switch unit 500 includes two thin film transistors: TFT T03 and TFT T04.

As illustrated in FIG. 19, the first electrode of the TFT T01 is connected with a high-level signal line SLH to be supplied with a high-level signal VGH, the second electrode of the TFT T01 is connected with a first electrode of the TFT T02, and the second electrode of the TFT T02 is connected with a low-level signal line SLL to be supplied with the low-level signal VGL. The first electrode of the TFT T03 is connected with the first voltage signal line SL1 to be supplied with a first voltage V1, and the second electrode of the TFT T03 is connected with the second voltage signal line SL2 to be supplied with a second voltage V2. For example, the first voltage signal line SL1 is a constant voltage signal line, and the second voltage signal line SL2 is a constant voltage signal line.

As illustrated in FIG. 19, the gate electrode of TFT T01 and the gate electrode of TFT T03 are connected with the light-emitting signal GOA unit 304, the gate electrode of TFT T02 is connected with the reset signal GOA unit 303, and the gate electrode of TFT T04 is connected with the second electrode of TFT T01 (the first electrode of TFT T02).

For example, when the light-emitting signal EM is at a low level, in the light-emitting phase, the output voltage of the first initialization signal Vinit1 is the first voltage V1 (higher voltage). When the light-emitting signal EM is at a high level, the output voltage of the reset signal RESET is at a low level, so that the lower voltage of the first initialization signal Vinit1 is output, and XEMS_INV is the bootstrap voltage output by the reset signal GOA unit 303. At this time, the output voltage of the first initialization signal Vinit1 is the second voltage V2. For example, the second voltage V2 is about −3V, and the first voltage V1 is in a range of 1V to 3V, but it is not limited to this case. For example, XEMS_INV is the reverse signal of XEMS.

For example, in the light-emitting phase t3, TFT T01 and TFT T03 are turned on, and TFT T02 and TFT T04 are turned off. In other phases than the light-emitting phase, TFT T01 and TFT T03 are turned off, and TFT T02 and TFT T04 are turned on. The phases other than the light-emitting phase may be the first reset phase t1, and the phases other than the light-emitting phase may be the first reset phase t1, the data writing and threshold compensation and second reset phase t2.

For example, the transistors in the pixel circuit of the embodiment of the present disclosure are all thin film transistors. For example, the first conductive pattern layer LY1, the second conductive pattern layer LY2, the third conductive pattern layer LY3, and the fourth conductive pattern layer LY4 are all made of metal materials. For example, the first conductive pattern layer LY1 and the second conductive pattern layer LY2 are formed of metal materials such as nickel and aluminum, but are not limited thereto. For example, the third conductive pattern layer LY3 and the fourth conductive pattern layer LY4 are formed of materials such as titanium, aluminum, etc., but are not limited thereto. For example, the third conductive pattern layer LY3 and the fourth conductive pattern layer LY4 are structures formed by three sub-layers of Ti/AL/Ti, but are not limited thereto. For example, the base substrate can be a glass substrate or a polyimide substrate, but it is not limited to this, and can be selected as required. For example, the first gate insulating layer GI1, the second gate insulating layer GI2, the interlayer insulating layer ILD, the passivation layer PVX, the first planarization layer PLN1, the second planarization layer PLN2, the pixel definition layer PDL, and the spacer PS are all made of insulating materials. The materials of the first electrode 201 and the second electrode 202 of the light-emitting element can be selected as required. In some embodiments, the first electrode 201 may use at least one of transparent conductive metal oxide and silver, but it is not limited thereto. For example, the transparent conductive metal oxide includes indium tin oxide (ITO), but is not limited thereto. For example, the first electrode 201 may adopt a structure in which three sub-layers of ITO-Ag-ITO are arranged. In some embodiments, the second electrode 202 may be a metal of a low work function, and at least one of magnesium and silver may be used, but is not limited thereto.

At least one embodiment of the present disclosure further provides a display device including any one of the above-mentioned display panels. For example, the display device includes an OLED or a low frame rate driven product including the OLED. For example, the display device includes any product or component that includes the above-mentioned display panel and has a display function, such as a TV, a digital camera, a mobile phone, a watch, a tablet computer, a notebook computer, a navigator, and the like.

At least one embodiment of the present disclosure further provides a driving method of a display panel, which includes: in a reset phase, resetting a gate electrode of a driving transistor and resetting a first electrode of a light-emitting element; resetting the gate electrode of the driving transistor including: setting a reset control signal to be a turn-on voltage, and turning on a first reset transistor, supplying a first voltage to the first electrode of the first reset transistor to transmit the first voltage to the gate electrode of the driving transistor through the first reset transistor, a second electrode being connected with the gate electrode of the driving transistor, a gate electrode of the first reset transistor being connected with a reset control signal line, and the reset control signal line being configured to supply the reset control signal; in a light-emitting phase, driving the light-emitting element to emit light, and supplying a second voltage to the first electrode of the first reset transistor, and the second voltage being greater than the first voltage.

For example, resetting the first electrode of the light-emitting element includes: transmitting an initialization signal to the first electrode of the light-emitting element through a second reset transistor. For example, the initialization signal is a direct current signal.

The above description takes the 7T1C pixel circuit as an example, and the embodiments of the present disclosure include but are not limited to this. It should be noted that the embodiments of the present disclosure do not limit the number of thin film transistors and the number of capacitors included in the pixel circuit. For example, in some other embodiments, the pixel circuit of the display substrate may also be a structure including transistors of other numbers, such as a 7T2C structure, a 6T1C structure, a 6T2C structure, or a 9T2C structure, which is not limited in the embodiments of the present disclosure.

In the embodiment of the present disclosure, the elements located in the same layer can be subjected to the same patterning process from the same film layer. For example, elements located in the same layer may be located on the surface of the same element facing away from the base substrate.

It should be noted that, for the sake of clarity, in the drawings used to describe the embodiments of the present disclosure, the thickness of a layer or region is enlarged. It should be understood that in the case where an element such as a layer, film, region or substrate is referred to as being "on" or "under" another element, the element can be "directly" on or "under" the other element, or there may be intermediate elements.

In the embodiments of present disclosure, patterning or a patterning process may only include a photolithography process, or include a photolithography process and an etching process, or include other processes such as a printing process, and an inkjet process to form a predetermined pattern. A photolithography process includes forming a pattern by processes such as film forming, exposure, and development etc., by using photoresist, mask, exposure machine etc. A proper process can be selected according to the structure to be formed in the embodiments of the present disclosure.

In case of no conflict, features in one embodiment or in different embodiments can be combined.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. A display panel, comprising:
   a light-emitting unit, comprising a pixel circuit and a light-emitting element, the pixel circuit being configured to drive the light-emitting element, the pixel circuit comprising a driving transistor, a first reset transistor and a second reset transistor; the first reset transistor being connected with a gate electrode of the driving transistor and configured to reset the gate electrode of the driving transistor, and the second reset transistor being connected with a first electrode of the light-emitting element and being configured to reset the first electrode of the light-emitting element;
   a first initialization signal line, connected with the gate electrode of the driving transistor through the first reset transistor; and
   a second initialization signal line, connected with the first electrode of the light-emitting element through the second reset transistor,
   wherein the first initialization signal line and the second initialization signal line are insulated from each other and are configured to supply signals respectively;
   the first reset transistor is a dual-gate transistor, the first reset transistor comprises a first channel and a second channel, and the first channel and the second channel are connected by a first conductive connection portion;
   the display panel further comprises a base substrate and a first power line which is configured to supply a first voltage signal to the pixel circuit; and
   an orthographic projection of the first conductive connection portion on the base substrate is completely within an orthographic projection of the first power line on the base substrate.

2. The display panel according to claim 1, wherein a first electrode of the first reset transistor is connected with the first initialization signal line, and a second electrode of the first reset transistor is connected with the gate electrode of the driving transistor;
   a first electrode of the second reset transistor is connected with the second initialization signal line, and a second electrode of the second reset transistor is connected with the first electrode of the light-emitting element.

3. The display panel according to claim 1, wherein the first initialization signal line is configured to supply an alternating current signal;
   the first initialization signal line is configured to supply a first voltage to the first reset transistor in a phase of resetting the gate electrode of the driving transistor and configured to supply a second voltage to the first reset transistor in a light-emitting phase of the light-emitting element, and the second voltage is greater than the first voltage.

4. The display panel according to claim 1, wherein the second initialization signal line is configured to supply a direct current signal.

5. The display panel according to claim 1, wherein the first initialization signal line and the second initialization signal line are both extended in a first direction, and the light-emitting unit comprises a first light-emitting unit and a second light-emitting unit that are adjacent to each other in a second direction, the second direction intersecting with the first direction;
   in the second direction, the second initialization signal line of the second light-emitting unit and the first initialization signal line of the first light-emitting unit are located between the driving transistor of the first light-emitting unit and the driving transistor of the second light-emitting unit; and
   the second initialization signal line of the second light-emitting unit is closer to the driving transistor of the first light-emitting unit than the first initialization signal line of the first light-emitting unit.

6. The display panel according to claim 5, wherein
   an orthographic projection of the first conductive connection portion of the first reset transistor of the first light-emitting unit on the base substrate at least partially falls within an orthographic projection of the second initialization signal line of the second light-emitting unit on the base substrate.

7. The display panel according to claim 6, further comprising a reset control signal line,
   wherein a first gate electrode and a second gate electrode of the first reset transistor are parts of the reset control signal line, respectively.

8. The display panel according to claim 6,
   wherein
   the pixel circuit further comprises a storage capacitor, a first electrode of the storage capacitor is connected with the gate electrode of the driving transistor, and a second electrode of the storage capacitor is connected with the first power line.

9. The display panel according to claim 8, wherein the gate electrode of the driving transistor is connected with a second electrode of the first reset transistor through a connecting line, and an orthographic projection of the first power line on the base substrate at least partially overlap with an orthographic projection of the connecting line on the base substrate.

10. The display panel according to claim 8, further comprising a power connection line, wherein the first power line is connected with the second electrode of the storage capacitor through the power connection line.

11. The display panel according to claim 10, further comprising a connection electrode,
    wherein one end of the connection electrode is electrically connected with the first initialization signal line, and the other end of the connection electrode is electrically connected with a first electrode of the first reset transistor;
    a plurality of connection electrodes and a plurality of power connection lines are provided, and the plurality of connection electrodes and the plurality of power connection lines are alternately arranged in the second direction.

12. The display panel according to claim 8, further comprising a gate line and a data line, wherein the gate line is configured to input a scan signal to the pixel circuit, and the data line is configured to input a data signal to the pixel circuit; and the pixel circuit further comprises a data writing transistor, a gate electrode of the data writing transistor is connected with the gate line, a first electrode of the data writing transistor is connected with the data line, and a second electrode of the driving transistor is connected with a first electrode of the driving transistor.

13. The display panel according to claim 12, wherein the pixel circuit further comprises a threshold compensation transistor, a gate electrode of the threshold compensation transistor is connected with the gate line, and a first electrode of the threshold compensation transistor is connected with a second electrode of the driving transistor, and a second electrode of the threshold compensation transistor is connected with the gate electrode of the driving transistor.

14. The display panel according to claim 8, further comprising a light-emitting control signal line, wherein the pixel circuit further comprises a first light-emitting control transistor and a second light-emitting control transistor, a gate electrode of the first light-emitting control transistor is connected with the light-emitting control signal line, a first electrode of the first light-emitting control transistor is connected with the first power line, and a second electrode of the first light-emitting control transistor is connected with a first electrode of the driving transistor;

a gate electrode of the second light-emitting control transistor is connected with the light-emitting control signal line, a first electrode of the second light-emitting control transistor is connected with a second electrode of the driving transistor, and a second electrode of the second light-emitting control transistor is connected with the first electrode of the light-emitting element.

15. The display panel according to claim 1, wherein orthographic projections of a first gate electrode and a second gate electrode of the first reset transistor on the base substrate are respectively overlapped with orthographic projections of the first channel and the second channel of the first reset transistor on the base substrate.

16. The display panel according to claim 1, wherein the first power line is in a grid shape and comprises a first portion extended in the first direction and a second portion extended in the second direction, and the first portion intersects with the second portion; and the first portion and the second portion are in a same layer and connected in an integral structure.

17. The display panel according to claim 16, wherein the threshold compensation transistor is a dual-gate transistor, the threshold compensation transistor comprises a first channel and a second channel, and the first channel and the second channel of the threshold compensation transistor are connected by a second conductive connection portion, and an orthographic projection of the second conductive connection portion on the base substrate is at least partially overlapped with the orthographic projection of the first power line on the base substrate.

18. The display panel according to claim 17, further comprising a blocking portion, wherein the blocking portion is connected with the first power line, an orthographic projection of the second conductive connection portion on the base substrate is at least partially overlapped with an orthographic projection of the blocking portion on the base substrate, and the blocking portion and the second conductive connection portion form a stabilization capacitor.

19. A display device comprising the display panel according to claim 1.

20. A driving method of the display panel according to claim 1, comprising:

in a reset phase, resetting the gate electrode of the driving transistor and resetting the first electrode of the light-emitting element; resetting the gate electrode of the driving transistor comprising: setting a reset control signal to be a turn-on voltage, and turning on a first reset transistor, supplying a first voltage to the first electrode of the first reset transistor to transmit the first voltage to the gate electrode of the driving transistor through the first reset transistor, a second electrode being connected with the gate electrode of the driving transistor, a gate electrode of the first reset transistor being connected with a reset control signal line, and the reset control signal line being configured to supply the reset control signal;

in a light-emitting phase, driving the light-emitting element to emit light, and supplying a second voltage to the first electrode of the first reset transistor, the second voltage being greater than the first voltage.

* * * * *